(12) United States Patent
Prabhakar et al.

(10) Patent No.: US 9,583,661 B2
(45) Date of Patent: *Feb. 28, 2017

(54) GRID FOR PLASMA ION IMPLANT

(71) Applicant: Intevac, Inc., Santa Clara, CA (US)

(72) Inventors: Vinay Prabhakar, Cupertino, CA (US); Babak Adibi, Los Altos, CA (US)

(73) Assignee: INTEVAC, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/073,427

(22) Filed: Mar. 17, 2016

(65) Prior Publication Data

US 2016/0204295 A1 Jul. 14, 2016

Related U.S. Application Data

(63) Continuation of application No. 14/135,519, filed on Dec. 19, 2013, now Pat. No. 9,318,332.

(Continued)

(51) Int. Cl.
*H01L 21/425* (2006.01)
*C23C 16/00* (2006.01)
(Continued)

(52) U.S. Cl.
CPC .... *H01L 31/0516* (2013.01); *H01J 37/32412* (2013.01); *H01J 37/32422* (2013.01);
(Continued)

(58) Field of Classification Search
CPC ..... C23C 14/042; C23C 14/044; C23C 14/48; H01J 37/3171; H01J 37/3172;
(Continued)

(56) References Cited

U.S. PATENT DOCUMENTS 3,607,450 A 9/1971 Kiewit
3,786,359 A 1/1974 King
(Continued)

FOREIGN PATENT DOCUMENTS

CN 1198597 A 11/1998
CN 1404619 A 3/2003
(Continued)

OTHER PUBLICATIONS

Anders, "Plasma and Ion Sources in Large Area Coating: A Review", Surface Coatings & Technology, Nov. 21, 2005, vol. 200, Issues: 5-6, pp. 1893-1906, Berkeley CA.
(Continued)

*Primary Examiner* — Kevin M Picardat
(74) *Attorney, Agent, or Firm* — Nixon Peabody LLP; Joseph Bach, Esq.

(57) ABSTRACT

A grid for minimizing effects of ion divergence in plasma ion implant. The plasma grid is made of a flat plate having a plurality of holes, wherein the holes are arranged in a plurality of rows and a plurality of columns thereby forming beamlets of ions that diverge in one direction. A mask is used to form the implanted shapes on the wafer, wherein the holes in the mask are oriented orthogonally to the direction of beamlet divergence.

20 Claims, 5 Drawing Sheets

Related U.S. Application Data

(60) Provisional application No. 61/869,022, filed on Aug. 22, 2013, provisional application No. 61/739,676, filed on Dec. 19, 2012.

(51) Int. Cl.

| | |
|---|---|
| *H01L 31/05* | (2014.01) |
| *H01L 21/266* | (2006.01) |
| *H01L 31/18* | (2006.01) |
| *H01L 31/068* | (2012.01) |
| *H01L 21/426* | (2006.01) |
| *H01J 37/32* | (2006.01) |

(52) U.S. Cl.
CPC ...... *H01J 37/32623* (2013.01); *H01L 21/266* (2013.01); *H01L 21/426* (2013.01); *H01L 31/0682* (2013.01); *H01L 31/1804* (2013.01); *H01L 31/188* (2013.01); *H01J 2237/20* (2013.01); *H01J 2237/3365* (2013.01); *Y02E 10/50* (2013.01); *Y02E 10/547* (2013.01); *Y02P 70/521* (2015.11)

(58) Field of Classification Search
CPC ........... H01J 37/32412; H01J 37/32422; H01J 37/32623; H01L 21/266; H01L 21/426; H01L 31/0682; H01L 31/0516; H01L 31/1804; H01L 31/188
USPC ...... 438/514, 517, 531; 118/723 R, 720, 721
See application file for complete search history.

(56) References Cited

U.S. PATENT DOCUMENTS

| | | |
|---|---|---|
| 3,790,412 A | 2/1974 | Moline |
| 3,948,682 A | 4/1976 | Bordina et al. |
| 3,969,163 A | 7/1976 | Wakefield |
| 3,969,746 A | 7/1976 | Kendall et al. |
| 3,976,508 A | 8/1976 | Mlavsky |
| 4,001,864 A | 1/1977 | Gibbons |
| 4,004,949 A | 1/1977 | Lesk |
| 4,021,276 A | 5/1977 | Cho et al. |
| 4,029,518 A | 6/1977 | Matsutani et al. |
| 4,056,404 A | 11/1977 | Garone et al. |
| 4,070,205 A | 1/1978 | Rahilly |
| 4,070,689 A | 1/1978 | Coleman et al. |
| 4,072,541 A | 2/1978 | Meulenberg, Jr. et al. |
| 4,086,102 A | 4/1978 | King |
| 4,090,213 A | 5/1978 | Maserjian et al. |
| 4,095,329 A | 6/1978 | Ravi |
| 4,116,717 A | 9/1978 | Rahilly |
| RE29,833 E | 11/1978 | Mlavsky |
| 4,131,486 A | 12/1978 | Brandhorst, Jr. |
| 4,131,488 A | 12/1978 | Lesk et al. |
| 4,141,756 A | 2/1979 | Chiang et al. |
| 4,144,094 A | 3/1979 | Coleman et al. |
| 4,152,536 A | 5/1979 | Ravi |
| 4,152,824 A | 5/1979 | Gonsiorawski |
| 4,179,311 A | 12/1979 | Athanas |
| 4,219,830 A | 8/1980 | Gibbons |
| 4,227,941 A | 10/1980 | Bozler et al. |
| 4,253,881 A | 3/1981 | Hezel |
| 4,273,950 A | 6/1981 | Chitre |
| 4,295,002 A | 10/1981 | Chappell et al. |
| 4,301,592 A | 11/1981 | Lin |
| 4,322,571 A | 3/1982 | Stanbery |
| 4,353,160 A | 10/1982 | Armini et al. |
| RE31,151 E | 2/1983 | King |
| 4,377,722 A | 3/1983 | Wested |
| 4,379,944 A | 4/1983 | Borden et al. |
| 4,404,422 A | 9/1983 | Green et al. |
| 4,421,577 A | 12/1983 | Spicer |
| 4,428,783 A | 1/1984 | Gessert |
| 4,448,865 A | 5/1984 | Bohlen et al. |
| 4,449,286 A | 5/1984 | Dahlberg |
| 4,456,489 A | 6/1984 | Wu |
| 4,479,027 A | 10/1984 | Todorof |
| 4,490,573 A | 12/1984 | Gibbons |
| 4,495,375 A | 1/1985 | Rickus et al. |
| 4,522,657 A | 6/1985 | Rohatgi et al. |
| 4,523,971 A | 6/1985 | Cuomo et al. |
| 4,524,237 A | 6/1985 | Ross et al. |
| 4,533,831 A | 8/1985 | Itoh et al. |
| 4,539,431 A | 9/1985 | Moddel et al. |
| 4,540,843 A | 9/1985 | Gochermann et al. |
| 4,542,256 A | 9/1985 | Wiedeman |
| 4,581,620 A | 4/1986 | Yamazaki et al. |
| 4,587,430 A | 5/1986 | Adler |
| 4,589,191 A | 5/1986 | Green et al. |
| 4,633,138 A | 12/1986 | Tokiguchi et al. |
| 4,665,277 A | 5/1987 | Sah et al. |
| 4,667,060 A | 5/1987 | Spitzer |
| 4,676,845 A | 6/1987 | Spitzer |
| 4,681,983 A | 7/1987 | Markvart et al. |
| 4,719,355 A | 1/1988 | Meyers et al. |
| 4,737,688 A | 4/1988 | Collins et al. |
| 4,742,381 A | 5/1988 | Fujii |
| 4,758,525 A | 7/1988 | Kida et al. |
| 4,828,628 A | 5/1989 | Hezel et al. |
| 4,830,678 A | 5/1989 | Todorof et al. |
| 4,834,805 A | 5/1989 | Erbert |
| 4,847,504 A | 7/1989 | Aitken |
| 4,886,555 A | 12/1989 | Hackstein et al. |
| 4,900,369 A | 2/1990 | Hezel et al. |
| 4,927,770 A | 5/1990 | Swanson |
| 4,933,021 A | 6/1990 | Swanson |
| 4,933,022 A | 6/1990 | Swanson |
| 4,967,088 A | 10/1990 | Stengl et al. |
| 5,009,720 A | 4/1991 | Hokuyo et al. |
| 5,112,409 A | 5/1992 | Warfield et al. |
| 5,125,983 A | 6/1992 | Cummings |
| 5,132,544 A | 7/1992 | Glavish |
| 5,136,171 A | 8/1992 | Leung et al. |
| 5,290,367 A | 3/1994 | Hayashi et al. |
| 5,306,647 A | 4/1994 | Lehmann et al. |
| 5,330,584 A | 7/1994 | Saga et al. |
| 5,340,454 A | 8/1994 | Schaefer et al. |
| 5,356,488 A | 10/1994 | Hezel |
| 5,374,456 A | 12/1994 | Matossian et al. |
| 5,391,886 A | 2/1995 | Yamada et al. |
| 5,421,889 A | 6/1995 | Pollack et al. |
| 5,516,725 A | 5/1996 | Chang et al. |
| 5,554,854 A | 9/1996 | Blake |
| 5,583,368 A | 12/1996 | Kenney |
| H001637 H | 3/1997 | Offord et al. |
| 5,641,362 A | 6/1997 | Meier |
| 5,693,376 A | 12/1997 | Fetherston et al. |
| 5,760,405 A | 6/1998 | King et al. |
| 5,831,321 A | 11/1998 | Nagayama |
| 5,883,391 A | 3/1999 | Adibi et al. |
| 5,885,896 A | 3/1999 | Thakur et al. |
| 5,907,158 A | 5/1999 | Nasser-Ghodsi et al. |
| 5,932,882 A | 8/1999 | England et al. |
| 5,935,345 A | 8/1999 | Kuznicki |
| 5,945,012 A | 8/1999 | Chan |
| 5,963,801 A | 10/1999 | Aronowitz et al. |
| 5,969,366 A | 10/1999 | England et al. |
| 5,985,742 A | 11/1999 | Henley et al. |
| 5,988,103 A | 11/1999 | Fetherston et al. |
| 5,994,207 A | 11/1999 | Henley et al. |
| 5,998,282 A | 12/1999 | Lukaszek |
| 5,999,268 A | 12/1999 | Yonezawa et al. |
| 6,006,253 A | 12/1999 | Kumar et al. |
| 6,010,579 A | 1/2000 | Henley et al. |
| 6,013,563 A | 1/2000 | Henley et al. |
| 6,016,036 A | 1/2000 | Brailove |
| 6,033,974 A | 3/2000 | Henley et al. |
| 6,034,321 A | 3/2000 | Jenkins |
| 6,048,411 A | 4/2000 | Henley et al. |
| 6,051,073 A | 4/2000 | Chu et al. |
| 6,060,718 A | 5/2000 | Brailove et al. |
| 6,083,324 A | 7/2000 | Henley et al. |
| 6,084,175 A | 7/2000 | Perry et al. |

(56) References Cited

U.S. PATENT DOCUMENTS

| | | | |
|---|---|---|---|
| 6,091,021 A | 7/2000 | Ruby et al. |
| 6,092,485 A | 7/2000 | Ando et al. |
| 6,093,625 A | 7/2000 | Wagner et al. |
| 6,103,599 A | 8/2000 | Henley et al. |
| 6,113,735 A | 9/2000 | Chu et al. |
| 6,120,660 A | 9/2000 | Chu et al. |
| 6,130,380 A | 10/2000 | Nakamura |
| 6,138,606 A | 10/2000 | Ling |
| 6,146,462 A | 11/2000 | Yializis et al. |
| 6,146,979 A | 11/2000 | Henley et al. |
| 6,150,708 A | 11/2000 | Gardner et al. |
| 6,153,524 A | 11/2000 | Henley et al. |
| 6,155,909 A | 12/2000 | Henley et al. |
| 6,159,824 A | 12/2000 | Henley et al. |
| 6,159,825 A | 12/2000 | Henley et al. |
| 6,162,705 A | 12/2000 | Henley et al. |
| 6,171,965 B1 | 1/2001 | Kang et al. |
| 6,180,496 B1 | 1/2001 | Farrens et al. |
| 6,184,111 B1 | 2/2001 | Henley et al. |
| 6,186,091 B1 | 2/2001 | Chu et al. |
| 6,200,883 B1 | 3/2001 | Taylor et al. |
| 6,204,151 B1 | 3/2001 | Malik et al. |
| 6,206,973 B1 | 3/2001 | Bailey et al. |
| 6,207,005 B1 | 3/2001 | Henley et al. |
| 6,213,050 B1 | 4/2001 | Liu et al. |
| 6,217,724 B1 | 4/2001 | Chu et al. |
| 6,221,740 B1 | 4/2001 | Bryan et al. |
| 6,221,774 B1 | 4/2001 | Malik |
| 6,228,176 B1 | 5/2001 | Chu et al. |
| 6,238,582 B1 | 5/2001 | Williams et al. |
| 6,245,161 B1 | 6/2001 | Henley et al. |
| 6,248,649 B1 | 6/2001 | Henley et al. |
| 6,258,173 B1 | 7/2001 | Kirimura et al. |
| 6,263,941 B1 | 7/2001 | Bryan et al. |
| 6,265,328 B1 | 7/2001 | Henley et al. |
| 6,269,765 B1 | 8/2001 | Chu et al. |
| 6,271,566 B1 | 8/2001 | Tsuchiaki |
| 6,274,459 B1 | 8/2001 | Chan |
| 6,281,428 B1 | 8/2001 | Chiu et al. |
| 6,287,941 B1 | 9/2001 | Kang et al. |
| 6,290,804 B1 | 9/2001 | Henley et al. |
| 6,291,313 B1 | 9/2001 | Henley et al. |
| 6,291,314 B1 | 9/2001 | Henley et al. |
| 6,291,326 B1 | 9/2001 | Henley et al. |
| 6,294,434 B1 | 9/2001 | Tseng |
| 6,300,227 B1 | 10/2001 | Liu et al. |
| 6,313,905 B1 | 11/2001 | Brugger et al. |
| 6,321,134 B1 | 11/2001 | Henley et al. |
| 6,335,534 B1 | 1/2002 | Suguro et al. |
| 6,338,313 B1 | 1/2002 | Chan |
| 6,365,492 B1 | 4/2002 | Suguro et al. |
| 6,383,876 B1 | 5/2002 | Son et al. |
| 6,391,740 B1 | 5/2002 | Cheung et al. |
| 6,417,515 B1 | 7/2002 | Barrett et al. |
| 6,429,037 B1 | 8/2002 | Wenham et al. |
| 6,448,152 B1 | 9/2002 | Henley et al. |
| 6,458,430 B1 | 10/2002 | Bernstein et al. |
| 6,458,723 B1 | 10/2002 | Henley et al. |
| 6,468,884 B2 | 10/2002 | Miyake et al. |
| 6,476,313 B2 | 11/2002 | Kawano |
| 6,486,478 B1 | 11/2002 | Libby et al. |
| 6,489,241 B1 | 12/2002 | Thilderkvist et al. |
| 6,495,010 B2 | 12/2002 | Sferlazzo |
| 6,500,732 B1 | 12/2002 | Henley et al. |
| 6,507,689 B2 | 1/2003 | Tirloni et al. |
| 6,534,381 B2 | 3/2003 | Cheung et al. |
| 6,544,862 B1 | 4/2003 | Bryan |
| 6,552,259 B1 | 4/2003 | Hosomi et al. |
| 6,552,414 B1 | 4/2003 | Horzel et al. |
| 6,594,579 B1 | 7/2003 | Lowrey et al. |
| 6,600,180 B1 | 7/2003 | Ueno et al. |
| 6,604,033 B1 | 8/2003 | Banet et al. |
| 6,611,740 B2 | 8/2003 | Lowrey et al. |
| 6,613,974 B2 | 9/2003 | Husher |
| 6,632,324 B2 | 10/2003 | Chan |
| 6,636,790 B1 | 10/2003 | Lightner et al. |
| 6,660,928 B1 | 12/2003 | Patton et al. |
| 6,732,031 B1 | 5/2004 | Lightner et al. |
| 6,752,912 B1 | 6/2004 | Sandhu |
| 6,759,807 B2 | 7/2004 | Wahlin |
| 6,767,439 B2 | 7/2004 | Park |
| 6,780,759 B2 | 8/2004 | Farrens et al. |
| 6,787,693 B2 | 9/2004 | Lizotte |
| 6,825,102 B1 | 11/2004 | Bedell |
| 6,827,824 B1 | 12/2004 | Blalock et al. |
| 6,874,515 B2 | 4/2005 | Ishihara et al. |
| 6,878,898 B2 | 4/2005 | Hogan et al. |
| 6,949,895 B2 | 9/2005 | DiVergilio et al. |
| 6,968,630 B2 | 11/2005 | Kato et al. |
| 7,011,733 B2 | 3/2006 | Sandhu |
| 7,022,984 B1 | 4/2006 | Rathmell et al. |
| 7,045,793 B2 | 5/2006 | Wahlin |
| 7,066,703 B2 | 6/2006 | Johnson |
| 7,078,317 B2 | 7/2006 | Henley |
| 7,081,186 B2 | 7/2006 | Ehiasarian et al. |
| 7,094,666 B2 | 8/2006 | Henley et al. |
| 7,098,394 B2 | 8/2006 | Armer et al. |
| 7,147,709 B1 | 12/2006 | Ong et al. |
| 7,166,520 B1 | 1/2007 | Henley |
| 7,174,243 B1 | 2/2007 | Lightner et al. |
| 7,225,047 B2 | 5/2007 | Al-Bayati et al. |
| 7,225,065 B1 | 5/2007 | Hunt et al. |
| 7,228,211 B1 | 6/2007 | Lowrey et al. |
| 7,250,323 B2 | 7/2007 | Gadeken et al. |
| 7,339,110 B1 | 3/2008 | Mulligan et al. |
| 7,354,815 B2 | 4/2008 | Henley |
| 7,390,724 B2 | 6/2008 | Henley et al. |
| 7,399,680 B2 | 7/2008 | Henley |
| 7,427,554 B2 | 9/2008 | Henley et al. |
| 7,447,574 B1 | 11/2008 | Washicko et al. |
| 7,477,968 B1 | 1/2009 | Lowrey et al. |
| 7,479,441 B2 | 1/2009 | Kirk et al. |
| 7,480,551 B1 | 1/2009 | Lowrey et al. |
| 7,498,245 B2 | 3/2009 | Aspar et al. |
| 7,521,699 B2 | 4/2009 | Yamazaki et al. |
| 7,523,159 B1 | 4/2009 | Williams et al. |
| 7,532,962 B1 | 5/2009 | Lowrey et al. |
| 7,532,963 B1 | 5/2009 | Lowrey et al. |
| 7,547,609 B2 | 6/2009 | Henley |
| 7,564,042 B2 | 7/2009 | Lee et al. |
| 7,598,153 B2 | 10/2009 | Henley et al. |
| 7,611,322 B2 | 11/2009 | Bluck et al. |
| 7,674,687 B2 | 3/2010 | Henley |
| 7,701,011 B2 | 4/2010 | Kamath et al. |
| 7,727,866 B2 | 6/2010 | Bateman et al. |
| 7,759,220 B2 | 7/2010 | Henley |
| 7,767,561 B2 | 8/2010 | Hanawa et al. |
| 7,772,088 B2 | 8/2010 | Henley et al. |
| 7,776,727 B2 | 8/2010 | Borden |
| 7,796,849 B2 | 9/2010 | Adibi et al. |
| 7,862,683 B2 | 1/2011 | Fukiage |
| 7,867,409 B2 | 1/2011 | Brcka |
| 8,058,156 B2 | 11/2011 | Hanawa et al. |
| 8,179,530 B2 | 5/2012 | Levy et al. |
| 8,286,517 B2 | 10/2012 | Lee et al. |
| 8,298,340 B2 | 10/2012 | Fukao et al. |
| 8,697,552 B2 | 4/2014 | Adibi et al. |
| 8,697,553 B2 | 4/2014 | Adibi et al. |
| 8,749,053 B2 | 6/2014 | Adibi et al. |
| 8,871,619 B2 | 10/2014 | Adibi et al. |
| 8,997,688 B2 | 4/2015 | Adibi et al. |
| 9,303,314 B2 | 4/2016 | Adibi et al. |
| 9,318,332 B2 * | 4/2016 | Prabhakar ......... H01J 37/32412 |
| 9,324,598 B2 | 4/2016 | Pederson et al. |
| 2001/0002584 A1 | 6/2001 | Liu et al. |
| 2001/0017109 A1 | 8/2001 | Liu et al. |
| 2001/0020485 A1 | 9/2001 | Ford et al. |
| 2002/0090758 A1 | 7/2002 | Henley et al. |
| 2002/0109233 A1 | 8/2002 | Farrar |
| 2002/0109824 A1 | 8/2002 | Yamaguchi |
| 2002/0139666 A1 | 10/2002 | Hsueh et al. |
| 2002/0144725 A1 | 10/2002 | Jordan et al. |
| 2002/0152057 A1 | 10/2002 | Wang et al. |
| 2002/0185700 A1 | 12/2002 | Coffa et al. |

(56) References Cited

U.S. PATENT DOCUMENTS

| | | |
|---|---|---|
| 2003/0015700 A1 | 1/2003 | Eisenbeiser et al. |
| 2003/0106643 A1 | 6/2003 | Tabuchi et al. |
| 2003/0116090 A1 | 6/2003 | Chu et al. |
| 2003/0129045 A1 | 7/2003 | Bonora et al. |
| 2003/0137050 A1 | 7/2003 | Chambers et al. |
| 2003/0215991 A1 | 11/2003 | Sohn et al. |
| 2003/0230986 A1 | 12/2003 | Horsky et al. |
| 2004/0025791 A1 | 2/2004 | Chen et al. |
| 2004/0025932 A1 | 2/2004 | Husher |
| 2004/0067644 A1 | 4/2004 | Malik et al. |
| 2004/0112426 A1 | 6/2004 | Hagino |
| 2004/0123804 A1 | 7/2004 | Yamazaki et al. |
| 2004/0185644 A1 | 9/2004 | Shibata et al. |
| 2004/0187916 A1 | 9/2004 | Hezel |
| 2004/0198028 A1 | 10/2004 | Tanaka et al. |
| 2004/0200520 A1 | 10/2004 | Mulligan et al. |
| 2004/0216993 A1 | 11/2004 | Sandhu |
| 2004/0232414 A1 | 11/2004 | Suthar et al. |
| 2005/0045835 A1 | 3/2005 | DiVergilio et al. |
| 2005/0133084 A1 | 6/2005 | Joge et al. |
| 2005/0150597 A1 | 7/2005 | Henley et al. |
| 2005/0163598 A1 | 7/2005 | Yuasa et al. |
| 2005/0181584 A1 | 8/2005 | Foad et al. |
| 2005/0183670 A1 | 8/2005 | Grantham et al. |
| 2005/0205211 A1 | 9/2005 | Singh et al. |
| 2005/0211170 A1 | 9/2005 | Hanawa et al. |
| 2005/0214477 A1 | 9/2005 | Hanawa et al. |
| 2005/0247668 A1 | 11/2005 | Malik et al. |
| 2005/0266781 A1 | 12/2005 | Jaenen et al. |
| 2006/0019039 A1 | 1/2006 | Hanawa et al. |
| 2006/0019477 A1 | 1/2006 | Hanawa et al. |
| 2006/0037700 A1 | 2/2006 | Shi et al. |
| 2006/0081180 A1 | 4/2006 | Aoki et al. |
| 2006/0144335 A1 | 7/2006 | Lee et al. |
| 2006/0148241 A1 | 7/2006 | Brody et al. |
| 2006/0157733 A1 | 7/2006 | Lucovsky et al. |
| 2006/0166394 A1 | 7/2006 | Kukulka et al. |
| 2006/0174829 A1 | 8/2006 | An et al. |
| 2006/0211219 A1 | 9/2006 | Henley et al. |
| 2006/0234484 A1 | 10/2006 | Lanzerotti et al. |
| 2006/0252217 A1 | 11/2006 | Rouh et al. |
| 2006/0279970 A1 | 12/2006 | Kernahan |
| 2007/0012503 A1 | 1/2007 | Iida |
| 2007/0029043 A1 | 2/2007 | Henley |
| 2007/0032044 A1 | 2/2007 | Henley |
| 2007/0035847 A1 | 2/2007 | Li et al. |
| 2007/0068624 A1 | 3/2007 | Jeon et al. |
| 2007/0081138 A1 | 4/2007 | Kerkhof et al. |
| 2007/0084505 A1 | 4/2007 | Zaidi |
| 2007/0087574 A1 | 4/2007 | Gupta et al. |
| 2007/0089833 A1 | 4/2007 | Inouchi et al. |
| 2007/0119373 A1 | 5/2007 | Kumar et al. |
| 2007/0132368 A1 | 6/2007 | Kuwahara et al. |
| 2007/0134840 A1 | 6/2007 | Gadeken et al. |
| 2007/0148336 A1 | 6/2007 | Bachrach et al. |
| 2007/0169806 A1 | 7/2007 | Fork et al. |
| 2007/0181820 A1 | 8/2007 | Hwang et al. |
| 2007/0181829 A1 | 8/2007 | Tanaka et al. |
| 2007/0209707 A1 | 9/2007 | Weltman |
| 2007/0214101 A1 | 9/2007 | Wang et al. |
| 2007/0217020 A1 | 9/2007 | Li et al. |
| 2007/0235074 A1 | 10/2007 | Henley et al. |
| 2007/0249131 A1 | 10/2007 | Allen et al. |
| 2007/0268089 A1 | 11/2007 | McKenzie et al. |
| 2007/0275569 A1 | 11/2007 | Moghadam et al. |
| 2007/0277875 A1 | 12/2007 | Gadkaree et al. |
| 2007/0281172 A1 | 12/2007 | Couillard et al. |
| 2007/0281399 A1 | 12/2007 | Cites et al. |
| 2007/0290283 A1 | 12/2007 | Park et al. |
| 2008/0000497 A1 | 1/2008 | Verhaverbeke |
| 2008/0001139 A1 | 1/2008 | Augusto |
| 2008/0038908 A1 | 2/2008 | Henley |
| 2008/0044964 A1 | 2/2008 | Kamath et al. |
| 2008/0078444 A1 | 4/2008 | Atanackovic |
| 2008/0090392 A1 | 4/2008 | Singh et al. |
| 2008/0092944 A1 | 4/2008 | Rubin |
| 2008/0092947 A1 | 4/2008 | Lopatin et al. |
| 2008/0116397 A1 | 5/2008 | Yoshida et al. |
| 2008/0121275 A1 | 5/2008 | Ito et al. |
| 2008/0121276 A1 | 5/2008 | Lopatin et al. |
| 2008/0128019 A1 | 6/2008 | Lopatin et al. |
| 2008/0128641 A1 | 6/2008 | Henley et al. |
| 2008/0164819 A1 | 7/2008 | Hwang et al. |
| 2008/0179547 A1 | 7/2008 | Henley |
| 2008/0188011 A1 | 8/2008 | Henley |
| 2008/0190886 A1 | 8/2008 | Choi et al. |
| 2008/0206962 A1 | 8/2008 | Henley et al. |
| 2008/0217554 A1 | 9/2008 | Abe |
| 2008/0242065 A1 | 10/2008 | Brcka |
| 2008/0275546 A1 | 11/2008 | Storey et al. |
| 2008/0284028 A1 | 11/2008 | Greywall |
| 2008/0296261 A1 | 12/2008 | Zhao et al. |
| 2008/0318168 A1 | 12/2008 | Szot et al. |
| 2009/0014725 A1 | 1/2009 | Nakanishi |
| 2009/0042369 A1 | 2/2009 | Henley |
| 2009/0056807 A1 | 3/2009 | Chen et al. |
| 2009/0081860 A1 | 3/2009 | Zhou et al. |
| 2009/0124064 A1 | 5/2009 | England et al. |
| 2009/0124065 A1 | 5/2009 | England et al. |
| 2009/0140132 A1 | 6/2009 | Lee et al. |
| 2009/0142875 A1 | 6/2009 | Borden et al. |
| 2009/0149001 A1 | 6/2009 | Cites et al. |
| 2009/0152162 A1 | 6/2009 | Tian et al. |
| 2009/0162970 A1 | 6/2009 | Yang |
| 2009/0206275 A1 | 8/2009 | Henley et al. |
| 2009/0227061 A1 | 9/2009 | Bateman et al. |
| 2009/0227062 A1 | 9/2009 | Sullivan et al. |
| 2009/0227094 A1 | 9/2009 | Bateman et al. |
| 2009/0227095 A1 | 9/2009 | Bateman et al. |
| 2009/0227097 A1 | 9/2009 | Bateman et al. |
| 2009/0246706 A1 | 10/2009 | Hendel et al. |
| 2009/0289197 A1 | 11/2009 | Slocum et al. |
| 2009/0308439 A1 | 12/2009 | Adibi et al. |
| 2009/0308440 A1 | 12/2009 | Adibi et al. |
| 2009/0308450 A1 | 12/2009 | Adibi et al. |
| 2009/0309039 A1 | 12/2009 | Adibi et al. |
| 2009/0317937 A1 | 12/2009 | Gupta et al. |
| 2009/0324369 A1 | 12/2009 | Scollay et al. |
| 2010/0025821 A1 | 2/2010 | Ohmi et al. |
| 2010/0041176 A1 | 2/2010 | Sullivan et al. |
| 2010/0055874 A1 | 3/2010 | Henley |
| 2010/0059362 A1 | 3/2010 | Anella |
| 2010/0062589 A1 | 3/2010 | Anella et al. |
| 2010/0062674 A1 | 3/2010 | Muraki |
| 2010/0087028 A1 | 4/2010 | Porthouse et al. |
| 2010/0096084 A1 | 4/2010 | Lee et al. |
| 2010/0110239 A1 | 5/2010 | Ramappa et al. |
| 2010/0124799 A1 | 5/2010 | Blake et al. |
| 2010/0159120 A1 | 6/2010 | Dzengeleski et al. |
| 2010/0167511 A1 | 7/2010 | Leung et al. |
| 2010/0170440 A9 | 7/2010 | Mizukami et al. |
| 2010/0178723 A1 | 7/2010 | Henley |
| 2010/0180945 A1 | 7/2010 | Henley et al. |
| 2010/0181654 A1 | 7/2010 | Fujiwara |
| 2010/0184243 A1 | 7/2010 | Low et al. |
| 2010/0184248 A1 | 7/2010 | Hilali et al. |
| 2010/0187611 A1 | 7/2010 | Schiwon |
| 2010/0196626 A1 | 8/2010 | Choi et al. |
| 2010/0197125 A1 | 8/2010 | Low et al. |
| 2010/0206713 A1 | 8/2010 | Li et al. |
| 2010/0224228 A1 | 9/2010 | Kim et al. |
| 2010/0229928 A1 | 9/2010 | Zuniga et al. |
| 2010/0240169 A1 | 9/2010 | Petti et al. |
| 2010/0240183 A1 | 9/2010 | Narazaki |
| 2010/0314552 A1 | 12/2010 | Tatemichi et al. |
| 2010/0323508 A1 | 12/2010 | Adibi et al. |
| 2011/0011734 A1 | 1/2011 | Marunaka et al. |
| 2011/0027463 A1 | 2/2011 | Riordon et al. |
| 2011/0097824 A1 | 4/2011 | Berliner et al. |
| 2011/0116205 A1 | 5/2011 | Schlitz |
| 2011/0124186 A1 | 5/2011 | Renau et al. |
| 2011/0135836 A1 | 6/2011 | Hays et al. |
| 2011/0162703 A1 | 7/2011 | Adibi et al. |
| 2011/0192993 A1 | 8/2011 | Chun et al. |

(56) References Cited

U.S. PATENT DOCUMENTS

| | | |
|---|---|---|
| 2011/0272012 A1 | 11/2011 | Heng et al. |
| 2011/0309050 A1 | 12/2011 | Iori et al. |
| 2012/0021136 A1 | 1/2012 | Dzengeleski et al. |
| 2012/0080082 A1 | 4/2012 | Suh |
| 2012/0103403 A1 | 5/2012 | Misra et al. |
| 2012/0118857 A1 | 5/2012 | Tyler et al. |
| 2012/0122273 A1 | 5/2012 | Chun et al. |
| 2012/0125259 A1 | 5/2012 | Adibi et al. |
| 2012/0129325 A1 | 5/2012 | Adibi et al. |
| 2012/0138230 A1 | 6/2012 | Bluck et al. |
| 2012/0199202 A1 | 8/2012 | Prajapati |
| 2012/0258606 A1 | 10/2012 | Holland et al. |
| 2012/0305063 A1 | 12/2012 | Moslehi et al. |
| 2013/0008494 A1 | 1/2013 | Bateman |
| 2013/0115764 A1 | 5/2013 | Pederson et al. |
| 2014/0166087 A1 | 6/2014 | Hieslmair et al. |
| 2014/0170795 A1 | 6/2014 | Prabhakar et al. |
| 2015/0072461 A1 | 3/2015 | Adibi et al. |
| 2016/0181465 A1 | 6/2016 | Adibi et al. |
| 2016/0233122 A1 | 8/2016 | Pederson et al. |
| 2016/0322523 A1 | 11/2016 | Hieslmair et al. |

FOREIGN PATENT DOCUMENTS

| | | |
|---|---|---|
| CN | 1445604 A | 10/2003 |
| CN | 1622294 A | 6/2005 |
| CN | 1638015 | 7/2005 |
| CN | 1763916 A | 4/2006 |
| CN | 101006572 A | 7/2007 |
| CN | 101055898 A | 10/2007 |
| CN | 101145569 A | 3/2008 |
| CN | 101490824 A | 7/2009 |
| CN | 102099870 A | 6/2011 |
| CN | 102099923 A | 6/2011 |
| CN | 102150277 A | 8/2011 |
| CN | 102150278 A | 8/2011 |
| CN | 102396068 A | 3/2012 |
| CN | 102804329 A | 11/2012 |
| CN | 102834905 A | 12/2012 |
| CN | 103370769 A | 10/2013 |
| CN | 104428883 A | 3/2015 |
| CN | 105051910 A | 11/2015 |
| DE | 4217428 | 6/1993 |
| DE | 19820152 | 11/1999 |
| DE | 112013006064 T5 | 8/2015 |
| EP | 1973145 A1 | 9/2008 |
| EP | 2304803 A1 | 4/2011 |
| EP | 2308060 A1 | 4/2011 |
| EP | 2319087 A1 | 5/2011 |
| EP | 2319088 A1 | 5/2011 |
| EP | 2409331 A1 | 1/2012 |
| EP | 2446458 | 5/2012 |
| EP | 2489757 A2 | 8/2012 |
| EP | 2534674 A1 | 12/2012 |
| EP | 2641266 A1 | 9/2013 |
| EP | 2777069 A2 | 9/2014 |
| JP | S57-132373 A | 8/1982 |
| JP | S62-15864 A | 1/1987 |
| JP | S62-237766 A | 10/1987 |
| JP | 63-143876 A | 6/1988 |
| JP | H01-290267 A | 11/1989 |
| JP | H02-201972 A | 8/1990 |
| JP | H03-180471 A | 8/1991 |
| JP | H04-221059 A | 8/1992 |
| JP | H06-47324 A | 2/1994 |
| JP | H09-321327 A | 2/1994 |
| JP | H07-135329 A | 5/1995 |
| JP | 8-298247 A | 11/1996 |
| JP | H10-084125 A | 3/1998 |
| JP | 2000-123778 A | 4/2000 |
| JP | 2001-189483 A | 7/2001 |
| JP | 2001-252555 A | 9/2001 |
| JP | 2001-517562 A | 10/2001 |
| JP | 2002-043404 A | 2/2002 |
| JP | 2002-057352 | 2/2002 |
| JP | 2002-083981 A | 3/2002 |
| JP | 2002-217430 A | 8/2002 |
| JP | 2002-540548 A | 11/2002 |
| JP | 2003-279493 A | 10/2003 |
| JP | 2004-031648 A | 1/2004 |
| JP | 2004-039751 A | 2/2004 |
| JP | 2004-193350 A | 7/2004 |
| JP | 2004-273826 A | 9/2004 |
| JP | 2005-005376 A | 1/2005 |
| JP | 2005-026554 A | 1/2005 |
| JP | 2005-123447 A | 5/2005 |
| JP | 2005-129597 A | 5/2005 |
| JP | 2005-322780 A | 11/2005 |
| JP | 2006-170733 A | 6/2006 |
| JP | 2006-196752 A | 7/2006 |
| JP | 2006-310373 A | 11/2006 |
| JP | 2007-053386 A | 3/2007 |
| JP | 2007-504622 A | 3/2007 |
| JP | 2007-207973 A | 8/2007 |
| JP | 2008-297584 A | 12/2008 |
| JP | 2009-049443 | 3/2009 |
| JP | 2009-129611 A | 6/2009 |
| JP | 2009-280835 A | 12/2009 |
| JP | 2010-141352 A | 6/2010 |
| JP | 2011-003913 A | 1/2011 |
| JP | 2011-524638 A | 9/2011 |
| JP | 2011-524639 A | 9/2011 |
| JP | 2011-524640 A | 9/2011 |
| JP | 2011-525301 A | 9/2011 |
| JP | 2012-521642 A | 9/2012 |
| JP | 2012-231520 A | 11/2012 |
| JP | 2012-531520 A | 12/2012 |
| JP | 2014-502048 | 1/2014 |
| JP | 5520290 B2 | 6/2014 |
| JP | 2015-504598 A | 2/2015 |
| KR | 10-2002-0059187 | 7/2002 |
| KR | 10-2007-0043157 A | 4/2007 |
| KR | 100759084 B1 | 9/2007 |
| KR | 20110042051 A1 | 4/2011 |
| KR | 20110042052 A | 4/2011 |
| KR | 20110042053 A1 | 4/2011 |
| KR | 20110050423 A1 | 5/2011 |
| KR | 20120027149 A1 | 3/2012 |
| KR | 20120034664 A1 | 4/2012 |
| KR | 20120137361 A | 12/2012 |
| KR | 20130129961 A | 11/2013 |
| KR | 10-2014-0110851 A | 9/2014 |
| SG | 174289 A1 | 10/2011 |
| SG | 176547 A1 | 1/2012 |
| SG | 183267 A1 | 9/2012 |
| SG | 186005 A1 | 12/2012 |
| SG | 190332 A1 | 6/2013 |
| TW | 428216 B | 4/2001 |
| TW | 200847217 A | 12/2008 |
| TW | 200933797 A | 8/2009 |
| TW | 201232796 A1 | 8/2012 |
| TW | 201320229 A | 5/2013 |
| TW | 201436258 A | 9/2014 |
| TW | I469368 B | 1/2015 |
| TW | I506719 B | 11/2015 |
| WO | 99/16111 A1 | 4/1999 |
| WO | WO02075816 A1 | 9/2002 |
| WO | WO2006019039 A1 | 2/2006 |
| WO | WO2007142865 | 12/2007 |
| WO | WO 2008009889 A1 | 1/2008 |
| WO | WO2009033134 A2 | 3/2009 |
| WO | WO2009033134 A3 | 3/2009 |
| WO | WO2009064867 A2 | 5/2009 |
| WO | WO2009064867 A3 | 5/2009 |
| WO | WO2009064872 A2 | 5/2009 |
| WO | WO2009064872 A3 | 5/2009 |
| WO | WO2009064875 A1 | 5/2009 |
| WO | WO2009085948 A2 | 7/2009 |
| WO | WO2009085948 A3 | 7/2009 |
| WO | WO2009111665 A2 | 9/2009 |
| WO | WO2009111665 A3 | 9/2009 |
| WO | WO2009111666 A2 | 9/2009 |
| WO | WO2009111666 A3 | 9/2009 |
| WO | WO2009111667 A2 | 9/2009 |

(56) References Cited

FOREIGN PATENT DOCUMENTS

| WO | WO2009111667 A3 | 9/2009 |
|---|---|---|
| WO | WO2009111668 A2 | 9/2009 |
| WO | WO2009111668 A3 | 9/2009 |
| WO | WO2009111668 A9 | 9/2009 |
| WO | WO2009111669 A2 | 9/2009 |
| WO | WO2009111669 A3 | 9/2009 |
| WO | WO2009152365 A1 | 12/2009 |
| WO | WO2009152368 A1 | 12/2009 |
| WO | WO2009152375 A1 | 12/2009 |
| WO | WO2009152378 A1 | 12/2009 |
| WO | WO2009155498 A2 | 12/2009 |
| WO | WO2009155498 A3 | 12/2009 |
| WO | WO2010030588 A2 | 3/2010 |
| WO | WO2010030645 A2 | 3/2010 |
| WO | WO2010030645 A3 | 3/2010 |
| WO | 2010/055876 A1 | 5/2010 |
| WO | WO2010108151 A1 | 9/2010 |
| WO | WO2010147997 A2 | 12/2010 |
| WO | WO2011005582 A1 | 1/2011 |
| WO | WO2011100363 A1 | 8/2011 |
| WO | WO2012068417 A1 | 5/2012 |
| WO | 2013070978 A2 | 5/2013 |
| WO | WO2014100043 A1 | 6/2014 |
| WO | WO2014100506 A1 | 6/2014 |

OTHER PUBLICATIONS

Armini et al., "A Non-Mass-Analyzed Solar Cell Ion Implanter", Nuclear Instruments and Methods in Physics Research B6 (1985) 94-99, North Holland, Amsterdam, Spire Corporation, Patriots Park, Bedford, Masachusetti 01730, USA.

Chun, M. et al., "Using Solid Phase Epitaxial Re-Growth for Ion Implantation in Solar Cell Fabrications", 26th European Photovoltaic Solar Energy Conference and Exhibition, Sep. 5, 2011 to Sep. 9, 2011, Hamburg (CCH Congress Centre & International Fair), Germany.

Com-Nougue et al., "CW CO2 Laser Annealing Associated with Ion Implantation for Production of Silicon Solar Cell Junctions", Jan. 1982, IEEE, p. 770.

Cornet et al., "A New Algorithm for Charge Deposition for Multiple-Grid Method for PIC Simulations in r-z Cylindrical Coordinates", www.sciencedirect.com, Journal of Computational Physics, Jul. 1, 2007, vol. 225, Issue: 1, pp. 808-828, Sydney, Australia.

Donnelly et al., "Nanopantography: A Method for Parallel Writing of Etched and Deposited Nanopatterns", Oct. 2009, University of Houston, Houston, TX, 36 pages.

Douglas et al., "A Study of the Factors Which Control the Efficiency of Ion-Implanted Silicon Solar Cells", IEEE Transactions on Electron Devices, vol. ED-27, No. 4, Apr. 1980, pp. 792-802.

Eaton Nova (Axcelis) 200E2 H/C Implanter, data sheet, 2 pgs., Jan. 1990.

Fu et al., "Enhancement of Implantation Energy Using a Conducting Grid in Plasma Immersion Ion Implantation of Dielectric/Polymeric Materials", Review of Scientific Instruments, vol. 74, No. 8, Aug. 2003, pp. 3697-3700.

Goeckner et al., "Plasma Doping for Shallow Junctions", Journal of Vacuum Science and Technology B, vol. 17, Issue 5, Sep. 1999, pp. 2290-2293.

Horzel, J. et al., "A Simple Processing Sequence for Selective Emitters", IEEE, 26th PVSC Conference Record of the Twenty-Sixth Photovoltaic Specialists Conference, Sep. 30-Oct. 3, 1997, Anaheim, CA, pp. 139-142.

"Implantation par Immersion Plasma (PULSION)", Ion Beam Services (IBS), Dec. 2008, ZI Peynier Rousset, France.

Jager-Hezel, K. "Developments for Large-Scale Production of High-Efficiency Silicon Solar Cells," Advances in Solid State Physics, vol. 34, Jan. 1994, pp. 97-113, <http://www.springerlink.com/content/982620t34312416v/>.

Janssens, et al., "Advanced Phosphorus Emitters for High Efficiency SI Solar Cells", 24th European Photovoltaic Solar Energy Conference, Sep. 21-25, 2009, Hamburg, Germany.

Kim, D-M. et al., "Dopant activation after ion shower doping for the fabrication of low-temperature poly-SI TFTs", Thin Solid Films, Elsevier-Sequoia S.A. vol. 475, No. 1-2, Mar. 22, 2005 pp. 342-347.

Kim, H.J. et al., "Construction and characterization of an amorphous silicon flat-panel detector based on ion-shower doping process", Nuclear Instruments & Methods in Physics Research, Section A: Accelerators, Spectrometers, Detectors, and Associated Equipment, Elsevier Science B.V., North Holland, vol. 505, No. 1-2, Jun. 1, 2003, pp. 155-158.

Kim, K-S et al., "PH3 Ion Shower Implantation and Rapid Thermal Anneal with Oxide Capping and Its Application to Source and Drain Formation of a Fully Depleted Silicon-on-Insulator Metal Oxide Semiconductor Field Effect Transistor", Japanese Journal of Applied Physics, vol. 43, No. 10, Oct. 1, 2004, pp. 6943-6947.

Kondratenko, S. et al, "Channeling Effects and Quad Chain Implantation Process Optimization for Low Energy Boron Ions," abstract, IEEE Xplore Digital Library, Issue date: Sep. 22-27, 2002, Current version date: Jan. 7, 2004, 1 pg., downloaded from ieeexplore.ieee.org/xpl/freeabs_all.jsp?arnumber=1257941.

Kroner, F. et al., "Phosphorus Ion Shower Doping System for TFT-LCD's", SPIE vol. 3014, 1997, pp. 31-37.

Kwok et al., "One-Step, Non-Contact Pattern Transfer by Direct-Current Plasma Immersion Ion Implantation", Journal of Physics D: Applied Physics, IOP Publishing, vol. 42, No. 19, Sep. 2009, pp. 1-6.

Kwok et al. "One-Step Non-Contact Pattern Transferring by Plasma Based Ion Implantation", Journal of Physics D: Applied Physics, IOP Publishing, vol. 41, No. 22, Oct. 2008, pp. 1-6.

"Leading Semiconductor Manufacturer Selects Axcelis HE3 Ion Implantation Equipment; 300 mm Facility to Choose Axcelis Platform for High Energy Implant," Business Wire, Oct. 17, 2000, 1 pg.

Minnucci et al., "Tailored Emitter, Low-Resistivity, Ion-Implanted Silicon Solar Cells", IEEE Transactions on Electron Devices, vol. ED-27, No. 4, Apr. 1980, pp. 802-806.

Mishima, Y. et al., "Non-mass-separated ion shower doping of polycrystalline silicon", J. Appl. Phys. vol. 75, No. 10, 1994, pp. 4933-4938.

Moon, B.Y. et al., "Fabrication of amorphous silicon p-i-n solar cells using ion shower doping technique", Solar Energy Materials and Solar Cells, vol. 49, No. 1-4, Dec. 1, 1997, pp. 113-119.

Mouhoub, A. et al., "Selective Emitters for Screen Printed Multicrystalline Silicon Solar Cells", Rev. Energ. Ren.: ICPWE, 2003, pp. 83-86.

Nakamoto, I. et al., "Ion Shower Doping System for TFT-LCD's", SPIE vol. 3014, 1997, pp. 31-37.

Neuhaus et al., "Industrial Silicon Wafer Solar Cells", Hindawl Publishing Corp, vol. 2007, pp. 1-15.

Nielsen, "Ion Implanted Polycrystalline Silicon Solar Cells", Physica Scripta, vol. 24, No. 2, Aug. 1, 1981, pp. 390-391.

Nikiforov et al., Large Volume ICP Sources for Plasma-based Accelerators, Korea Elecrtrotechnology Research Institute (KERI), APAC 2004, Gyeongju, Korea.

Nitodas, S.F., et al., "Advantages of single and mixed species chaining for high productivity in high and mid-energy implantation," published Sep. 2002, Ion Implantation Technology, Current version date Jan. 7, 2004, abstract, downloaded from ieeexplore.ieee.org., 1 pg.

Pelletier et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.

Rentsch, et al. "Technology Route Towards Industrial Application of Rear Passivated Silicon Solar Cells", Conference Record of the 2006 IEEE 4th World Conference on Photovoltaic Energy Conversion. vol. 1 (2006) pp. 1008-1011, May 2006.

Semiconductor Consulting Service publication: "Process Technology for the 21st Century," Chapter 10—Substrates, Isolation, Well and Transistor Formation, Jan. 1999, downloaded from IC Knowledge.com, http://www.icknowledge.com/our_products/pt21c.html., pp. 10-1-10-4.

Sopian et al., "Plasma Implantation for Emitter and Localized Back Surface Field (BSF) Formation in Silicon Solar Cells", European

(56) References Cited

OTHER PUBLICATIONS

Journal of Scientific Research, http://www.eurojournals.com/ejsr.htm, ISSN 1450-216X, vol. 24, No. 3, Jan. 2008, pp. 365-372.
Steckl, "Particle-beam Fabrication and in Situ Processing of Integrated Circuits", IEEE Xplore, Dec. 1986, vol. 74, Issue 12.
Szlufcik, J. et al., "Advanced concepts of industrial technologies of crystalline silicon solar cells", Interuniversity Microelectronics Centre (IMEC) Leuven, Beligium, Opto-Electronics Review, vol. 8, Issue 4, 2000, pp. 299-306.
Tang et al., "Current Control for Magnetized Plasma in Direct-Current Plasma-Immersion Ion Implantation", American Institute of Physics, Applied Physics Letters, vol. 82, No. 13, Mar. 31, 2003, pp. 2014-2016.
Vervisch et al., "Plasma Immersion Ion Implantation Applied to P+N Junction Solar Cells", CP866, Ion Implantation Technology, American Institute of Physics, vol. 866, Jan. 2006, pp. 253-256.
"Varian Introduces a New High-Energy Ion Implant System for Optimized Performance and Lowest Cost of Ownership," Press Release, Business Wire, Jul. 14, 1999, 1 pg.
Walther, S.R. et al., "Using Multiple Implant Regions to Reduce Development Wafer Usage", Jan. 1, 2006, American Institute of Physics, CP866, Ion Implantation Technology, pp. 409-412.
Wu, Y. et al., "Large-area shower implanter for thin-film transistors", IEE Proceedings-G Circuits, Devices and Systems, Institution of Electrical Engineers, vol. 141, No. 1, Feb. 1, 1994, pp. 23-36.
Xu et al., "Etching of Nanopatterns in Silicon Using Nanopantography", Applied Physics Letters, vol. 92, Jan. 9, 2008, pp. 1-3.
Xu et al., "Nanopantography: A New Method for Massively Parallel Nanopatterning Over Large Areas", Nano Letters, vol. 5, No. 12, Jan. 2005, pp. 2563-2568.
Yankov et al., "Plasma Immersion Ion Implantation for Silicon Processing", Annalen der Physik, vol. 10, Issue: 4, Feb. 2001, pp. 279-298.
Young et al., "High-Efficiency Si Solar Cells by Beam Processing", Applied Physics Letters, vol. 43, Issue: 7, Oct. 1, 1983, pp. 666-668.
Younger et al, "Ion Implantation Processing for High Performance Concentrator Solar Cells and Cell Assemblies," Solar Cells, vol. 6, 1982, pp. 79-86.
Zeng et al., "Steady-State, Direct-Current (DC) Plasma Immersion Ion Implantation (PIII) for Planar Samples", IEEE, Jan. 2000, pp. 515-519.
Zeng et al., "Steady-State Direct-Current Plasma Immersion Ion Implantation Using an Electron Cycoltron Resonance Plasma Source", Thin Solid Films, www.elsevier.com/locate/tsf, vol. 390, Issues: 1-2, Jun. 30, 2001, pp. 145-148.
Office Action in U.S. Appl. No. 13/312,957, dated Dec. 15, 2014.
Office Action in U.S. Appl. No. 13/299,292 dated Nov. 13, 2013.
Office Action in U.S. Appl. No. 13/299,292 dated May 12, 2014.
International Search Report and Written Opinion for PCT/US2011/061274 mailed on Mar. 29, 2012.
International Preliminary Report on Patentability for PCT/US2011/061274 mailed on May 30, 2013.
Extended Search Report in European Patent Application No. 11841747.6, mailed Jul. 24, 2014.
First Office Action in Chinese Patent Application No. 201180060732.4 dated May 11, 2015.
Second Office Action for Chinese Patent Application No. 201180060732.4 dated Jan. 29, 2016.
Taiwan Office Action in Application No. 100141931 mailed on Jan. 7, 2014.
Notice of Allowance in Taiwanese Patent Application No. 100141931 mailed on Oct. 2, 2014.
International Search Report and Written Opinion for PCT/US2013/075869 mailed on Apr. 16, 2014.
International Preliminary Report on Patentability for PCT/US2013/075869 mailed on Mar. 26, 2015.
Office Action issued in Chinese Patent Application No. 201380066749.X dated Apr. 19, 2016.
Office Action in U.S. Appl. No. 12/482,685 mailed on Feb. 28, 2012.
Office Action in U.S. Appl. No. 12/482,685 mailed on Jun. 6, 2012.
Notice of Allowance in U.S. Appl. No. 12/482,685 mailed on Sep. 6, 2012.
Office Action in U.S. Appl. No. 12/482,685 mailed on Jan. 28, 2013.
Office Action in U.S. Appl. No. 12/482,685 mailed on Jun. 25, 2013.
Office Action in U.S. Appl. No. 12/482,685 mailed Nov. 18, 2013.
Notice of Allowance in U.S. Appl. No. 12/482,685 mailed on Dec. 6, 2013.
International Search Report and Written Opinion for PCT/US2009/047090 mailed on Jul. 31, 2009.
International Preliminary Report on Patentability for PCT/US2009/047090 mailed on Dec. 23, 2010.
First Office Action in Chinese Application No. 200980128201.7, mailed on Dec. 5, 2012.
Second Office Action in Chinese Application No. 200980128201.7 mailed on Aug. 23, 2013.
Third Office Action in Chinese Application No. 200980128201.7 mailed on Apr. 9, 2014.
Fourth Office Action in Chinese Application No. 200980128201.7 mailed on Oct. 24, 2014.
Decision of Rejection in Chinese Application No. 200980128201.7 mailed on Mar. 2, 2015.
Board Opinion in Chinese Patent Application No. 200980128201.7 mailed on Dec. 4, 2015.
Japanese Office Action in Application No. 2011-513699 mailed on Jul. 23, 2013.
Decision to Grant in Japanese Application No. 2011-513699 mailed on Mar. 11, 2014.
Examination Report in Singapore Application No. 201009185-8 dated Jul. 26, 2012.
Office Action in U.S. Appl. No. 12/482,947 mailed on Jun. 7, 2012.
Office Action in U.S. Appl. No. 12/482,947 mailed on Nov. 13, 2013.
Notice of Allowance in U.S. Appl. No. 12/482,947 mailed on Jun. 25, 2014.
International Search Report and Written Opinion for PCT/US2009/047094 mailed on Oct. 2, 2009.
International Preliminary Report on Patentability for PCT/US2009/047094 mailed on Dec. 23, 2010.
Extended Search Report in European Application No. 09763656.7, dated Sep. 13, 2013.
Chinese Office Action in Application No. 200980127944.2 mailed on Feb. 16, 2013.
Japanese Office Action in Application No. 2011-513701 mailed on Jan. 7, 2014.
Decision of Rejection in Japanese Office Action in Application No. 2011-513701 mailed on Jun. 10, 2014.
Written Opinion in Singapore Application No. 201009193-2 mailed on Mar. 18, 2013.
Office Action in U.S. Appl. No. 12/482,980 mailed on Aug. 24, 2012.
Office Action in U.S. Appl. No. 12/482,980 mailed on Feb. 27, 2013.
Advisory Action in U.S. Appl. No. 12/482,980 mailed on Apr. 9, 2013.
International Search Report and Written Opinion for PCT/US2009/047102 mailed on Aug. 4, 2009.
International Preliminary Report on Patentability for PCT/US2009/047102 mailed on Dec. 23, 2010.
Chinese Office Action in Application No. 200980127945.7 mailed on Aug. 31, 2012.
Chinese Office Action in Application No. 200980127945.7 mailed on Jul. 25, 2013.
Chinese Office Action in Application No. 200980127945.7 mailed on Jan. 13, 2014.
Board Opinion in Chinese Patent Application No. 200980127945.7 dated Jun. 30, 2015.
Notification of Grant for Chinese Patent Application No. 200980127945.7 dated Jan. 25, 2016.
First Japanese Office Action in Application No. 2011-513705 mailed on Jul. 16, 2013.

(56) References Cited

OTHER PUBLICATIONS

Decision for Rejection in Japanese Patent Application No. 2011-513705 mailed on Jan. 7, 2014.
Notice of Reasons for Preliminary Rejection for Korean Patent Application No. 10-2011-7000467 dated Jul. 26, 2015.
Written Opinion in Singapore Patent Application No. 201009191-6 dated Jul. 11, 2012.
2nd Written Opinion in Singapore Patent Application No. 201009191-6 dated Jun. 14, 2013.
Examination Report in Singapore Patent Application No. 201009191-6 dated Feb. 11, 2014.
Office Action in U.S. Appl. No. 12/483,017 mailed on Sep. 25, 2012.
Office Action in U.S. Appl. No. 12/483,017 mailed on Apr. 23, 2013.
Office Action in U.S. Appl. No. 12/483,017 mailed on Oct. 4, 2013.
International Search Report and Written Opinion for PCT/US2009/047109 mailed on Jul. 29, 2009.
International Preliminary Report on Patentability for PCT/US2009/047109 mailed on Dec. 23, 2010.
Chinese Office Action in Application No. 200980128202.1, mailed on May 8, 2013.
Japanese Office Action in Application No. 2011-513706, mailed on Jul. 30, 2013.
Second Office Action in Japanese Application No. 2011-513706, mailed on Apr. 1, 2014.
Decision for Rejection in Japanese Application No. 2011-513706, mailed on Sep. 2, 2014.
Written Opinion in Singapore Patent Application No. 201009194-0 dated Jul. 11, 2012.
Examination Report in Singapore Application No. 201009194-0 dated Jun. 25, 2013.
Office Action in U.S. Appl. No. 12/728,105 mailed on Jan. 14, 2013.
Office Action in U.S. Appl. No. 12/728,105 mailed on May 21, 2013.
International Search Report and Written Opinion for PCT/US2010/028058 mailed on May 25, 2010.
International Preliminary Report on Patentability for PCT/US2010/028058 mailed on Sep. 29, 2011.
Chinese Office Action in Application No. 201080012752.X mailed on Aug. 8, 2013.
Second Chinese Office Action in Application No. 201080012752.X mailed on Jan. 8, 2014.
Japanese Office Action in Application No. 2012-501017 mailed Nov. 26, 2013.
Decision for Rejection in Japanese Patent Application No. 2012-501017 mailed on Apr. 22, 2014.
Office Action in Korean Patent Application No. 10-2011-7024287 dated May 16, 2016, with English translation (21 pgs).
Written Opinion in Singapore Patent Application No. 201106457-3 dated Jun. 5, 2012.
Examination Report in Singapore Patent Application No. 201106457-3 dated Jan. 18, 2013.
Office Action in U.S. Appl. No. 12/821,053 mailed on Mar. 15, 2012.
Office Action in U.S. Appl. No. 12/821,053 mailed on Aug. 17, 2012.
Office Action in U.S. Appl. No. 12/821,053 mailed on Jan. 16, 2013.
Office Action in U.S. Appl. No. 12/821,053 mailed on Aug. 13, 2013.
Advisory Action in U.S. Appl. No. 12/821,053 mailed on Jan. 9, 2014.
Notice of Allowance in U.S. Appl. No. 12/821,053 mailed on Feb. 27, 2014.
International Search Report and Written Opinion in International Application No. PCT/US10/39690 dated Oct. 7, 2010.
International Preliminary Report on Patentability for PCT/US10/39690 mailed on Jan. 12, 2012.
Extended Search Report in European Patent Application No. 10797606.0, dated Jun. 18, 2015.
First Office Action and Examination Report in Chinese Patent Application No. 201080025312.8, dated Sep. 10, 2014.
Office Action in Japanese Patent Application No. 2012-517699 dated Aug. 26, 2014.
Office Action for Japanese Patent Application No. 2012-517699 dated May 12, 2015.
Decision to Grant Japanese Patent Application No. 2012-517699 dated Jan. 5, 2016.
Korean Office Action in Application No. 10-2011-7030721, dated Nov. 21, 2013.
Decision to Grant in Korean Office Action in Application No. 10-2011-7030721, dated May 31,2014.
Written Opinion and Search Report in Singapore Patent Application No. 201107307-9, mailed on May 17, 2013.
Examination Report in Singapore Patent Application No. 201107307-9, mailed on Jan. 30, 2014.
Office Action in U.S. Appl. No. 13/363,341 mailed on Apr. 5, 2013.
Office Action in U.S. Appl. No. 13/363,341 mailed Nov. 25, 2013.
Notice of Allowance in U.S. Appl. No. 13/363,341, mailed Jun. 19, 2014.
Partial Search Report in European Patent Application No. 12164231.8, dated Jun. 17, 2015.
Extended Search Report in European Patent Application No. 12164231.8, dated Dec. 9, 2015.
Notice of Allowance in U.S. Appl. No. 13/363,347, mailed on Nov. 21, 2013.
Notice of Allowance in U.S. Appl. No. 14/510,109 dated Oct. 15, 2015.
Office Action in U.S. Appl. No. 13/024,251, mailed Jan. 28, 2014.
Office Action in U.S. Appl. No. 13/024,251, mailed Jun. 23, 2014.
Office Action in U.S. Appl. No. 13/024,251 mailed on Feb. 10, 2015.
Office Action in U.S. Appl. No. 13/024,251 mailed on Aug. 17, 2015.
International Search Report and Written Opinion for PCT/US2011/024244, mailed on Apr. 6, 2011.
International Preliminary Report on Patentability for PCT/US2011/024244, mailed on Aug. 23, 2012.
Extended Search Report in European Patent Application No. 11742754.2, dated Apr. 28, 2014.
First Office Action and Examination Report in Chinese Patent Application No. 201180018217.X, dated Nov. 3, 2014.
Second Office Action in Chinese Patent Application No. 201180018217.X, dated Jun. 9, 2015.
Office Action in Chinese Patent Application No. 201180018217.X dated Oct. 19, 2015.
Notice of Grant for Chinese Patent Application No. 201180018217.X dated Jan. 29, 2016.
Office Action in U.S. Appl. No. 13/871,871 dated Jan. 21, 2016.
Extended Search Report in European Patent Application No. 14176404.3, dated Nov. 14, 2014.
Office Action in U.S. Appl. No. 14/135,519 dated Jul. 9, 2015.
Notice of Allowance in U.S. Appl. No. 14/135,519 dated Nov. 18, 2015.
International Search Report and Written Opinion for PCT/US2013/076741, mailed on Apr. 18, 2014.
International Preliminary Report on Patentability for PCT/US2013/076741, mailed on Jul. 2, 2015.
First Office Action and Examination Report in Taiwanese Patent Application No. 102147302, dated Apr. 8, 2015.
Office Action in U.S. Appl. No. 15/073,427 dated May 20, 2016.
Office Action in Taiwanese Patent Application No. 102147302, dated Jul. 22, 2015.
Board Decision in Chinese Patent Application No. 200980127945.7 dated Dec. 29, 2015. Rejection Reversed.
Examination Report for Taiwanese Patent Application No. 101141546 dated Sep. 16, 2014.
Examination Report in Singapore Patent Application No. 11201402177X dated Aug. 18, 2015.
Final Office Action in U.S. Appl. No. 13/719,145 dated Sep. 17, 2015.
First Office Action for Chinese Patent Application No. 201280061122.0 dated Apr. 29, 2016.

(56) References Cited

OTHER PUBLICATIONS

International Preliminary Report on Patentability PCT/US2012/064241 mailed on May 22, 2014.
International Search Report and Written Opinion in International Application No. PCT/US2012/064241 mailed on Mar. 26, 2013.
Notice of Allowance in U.S. Appl. No. 13/672,652 dated Dec. 22, 2015.
Office Action in U.S. Appl. No. 13/672,652, mailed on Feb. 17, 2015.
Office Action in U.S. Appl. No. 13/719,145, mailed on Mar. 30, 2015.
Office Action in U.S. Appl. No. 13/672,652 dated Sep. 10, 2015.
Office Action in U.S. Appl. No. 13/719,145 dated Jan. 12, 2016.
Restriction Requirement in U.S. Appl. No. 12/482,685 dated Feb. 1, 2012.
Restriction Requirement in U.S. Appl. No. 12/482,980 dated Apr. 24, 2012.
Restriction Requirement in U.S. Appl. No. 12/483,017 dated Apr. 25, 2012.
Restriction Requirement in U.S. Appl. No. 12/728,105 dated Oct. 5, 2012.
Restriction Requirement in U.S. Appl. No. 13/024,251 mailed on Jun. 19, 2013.
Restriction Requirement in U.S. Appl. No. 13/299,292 dated Aug. 13, 2013.
Restriction Requirement in U.S. Appl. No. 13/363,347, mailed on Jul. 9, 2013.
Restriction Requirement in U.S. Appl. No. 13/672,652, mailed on Aug. 8, 2014.
Restriction Requirement in U.S. Appl. No. 13/719,145, mailed on Dec. 10, 2014.
Second Board Opinion for Chinese Patent Application No. 200980128201.7 dated Jun. 1, 2016.
Third Office Action for Chinese Patent Application No. 201180060732.4 dated Jun. 20, 2016.
Written Opinion in Singapore Patent Application No. 11201402177X, mailed on Mar. 11, 2015.
Examination Report for Taiwanese Patent Application No. 101141546 dated Mar. 25, 2015.
Extended Search Report in European Patent Application No. 12847303.0, dated Dec. 16, 2014.
Office Action in U.S. Appl. No. 13/719,145 dated Oct. 19, 2016.
Search Report and Written Opinion for Singapore Patent Application No. 10201500916V dated Aug. 5, 2016.
Second Office Action for Chinese Patent Application No. 201380066749.X dated Dec. 9, 2016.
Examination Report in European Patent Application No. 12847303.0 dated Dec. 7, 2016.
Notice of Grant for Chinese Patent Application No. 201280061122.0 dated Nov. 3, 2016.
Notice of Grant for Japanese Patent Application No. 2014-541275 dated Nov. 22, 2016.
Office Action for U.S. Appl. No. 15/099,523 dated Dec. 14, 2016.
Restriction Requirement for U.S. Appl. No. 15/054,049 dated Dec. 19, 2016.

\* cited by examiner

GRID FOR PLASMA ION IMPLANT

RELATED APPLICATIONS

This application is a continuation application of U.S. patent application Ser. No. 14/135,519, filed on Dec. 19, 2013, which claims priority benefit from U.S. Provisional Application No. 61/869,022, filed on Aug. 22, 2013, and U.S. Provisional Application No. 61/739,676, filed on Dec. 19, 2012, the disclosures of which are incorporated herein by reference in their entireties.

BACKGROUND

1. Field

This invention relates to plasma ion implant, such as used for fabrication of semiconductor devices, particularly solar cells.

2. Related Arts

Diffused junction solar cells are known in the art. Such cells are fabricated by doping a silicon substrate with dopants such as boron and phosphorous. Metallic contacts are then fabricated to collect current generated by the cell. Also known are cells referred to front contact cells where selective n++ emitter can be formed, wherein high doping concentration is provided at the area of the emitter's surface where the metallic contacts are deposited. Generally, blanket doping is done using POC13 diffusion. Another known solar cell, in back contact cell that is generally referred to as point contact or interdigitated back-contact, or IBC, cell, wherein all of the electrical contacts are provided only on the backside of the solar cell. The selective emitter and IBC cells requires both a blanket doping of the entire sun-facing area of the wafer and selective doping only on selected areas of the backside of cell. For example, for selective emitter the areas that form the contact to the metal lines on the sun-facing surface of the solar cell are selectively doped at a higher dose than the background blanket doping. On the other hand, IBC cells require alternating areas of p-type and n-type doped areas, that are generally formed in separate steps using, e.g., masks.

The requirement for IBC masks to be able to provided varying doped patterned implant region is very rigorous. The opening in such mask can be a range such 200 to 1000 micron, and traverse the whole length of the substrate. The spacing or pitch of these line, for each dopant, can a range less than 1000 micron, where the lines for the opposing doped line can land in between and positioned to high precision. Fabrication of such a mask, may render it non-rigid and difficult to make, handle and use in an ion implant system. Any means of cross stitching the openings will lead to shadowing of the doped lines and hence render the doped line with poor or intermittent conductivity.

In addition there is a requirement for the selective implantation to be in two dimensional, where there are patterns that are in both x and y direction across the surface of the substrate. These could include lines with corners, deviation, shaped to accommodate the current flow, circles, halo, dots and other 2D shapes.

While it has been proposed that ion implantation can result in better doping profiles and, therefore, better cell efficiency, ion implantation has not been used due to the high cost and slow throughput of standard ion implantation equipment. However, with the increased demand for improved cell efficiency and for formation of selective emitter or IBC cells, market demand developed for ion implant technologies that can deliver the required low cost and high throughput. Consequently, certain solutions are emerging, which are plasma-based ion implant. One solution is generally referred to as plasma immersion ion implantation, PIII, in which plasma engulfs that substrate to be implanted. A related solution is to insert a grid assembly between the plasma and the substrate, such that ion are extracted from the plasma and are implanted onto the substrate, without the plasma contacting the substrate. While this solution seems promising, it requires modifications and improvement in order to enable selecting implantation.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide plasma ion implant that incorporate grid and masks designs for selective implantation.

Certain disclosed embodiments provide for grid and masks designs that either avoid or take advantage of beam divergence, depending on the particular application.

Disclosed embodiments provide grid designs that enable placement of implant mask either on top of, or above and separated from, the surface of the wafer.

Various embodiments disclosed herein provide for a plasma ion implant grid and mask that are easy to manufacture and can withstand service conditions existing within the plasma chamber.

Still other embodiments provide for method of selective implantation through a grid and a mask such that the natural phenomenon of beam divergence is controlled and taken advantage of.

According to aspects of the invention, a grid for a plasma ion implant is provided, comprising a flat plate having a plurality of elongated holes or slots dispersed over its surface, each of the elongated holes having a cross-sectional shape of an elongated oval having a major axis and minor axis, and having a defined depth extending through the flat plate, wherein a major axis of each of the elongated holes is configured to be aligned in a direction perpendicular to a long axis of features to be implanted on a substrate when the grid is installed inside a plasma ion implant system. The plurality of elongated holes may be arranged in a plurality of rows and a plurality of columns, such that each of the holes in each column are aligned with the holes in the preceding and following column, such that a line passing through the major axis of holes in the same row would intersect at a right angle a line passing through the minor axis of holes aligned in the same column. The plurality of elongated holes are arranged in a plurality of rows and a plurality of columns, such that each of the holes in each column is shifted from alignment with the holes in the preceding and following column, such that a line passing through the center of all of the holes in a selected column forms an acute angle with a line passing through the major axis of holes in the same row.

According to another aspect, a combination of exit grid and implant mask for a plasma-based ion implant system is provided, wherein: the exit grid comprises a flat plate having a plurality of elongated holes dispersed over its surface, each of the elongated holes having a cross-sectional shape of an elongated oval having a major axis and minor axis, and having a defined depth extending through the flat plate to enable ions to pass through the elongated holes; the implant mask comprises a flat plate having a plurality of linear holes dispersed over its surface, each of the linear holes having a cross-sectional shape of an elongated oval having a long axis and short axis, and having a defined depth extending through the flat plate to enable ions to pass through the linear holes, wherein the linear holes are arranged in a plurality of parallel rows and linear holes in each row are separated from each other by ion blocking bridges; and, wherein a major axis of each of the elongated holes is aligned in a direction perpendicular to a long axis of the linear holes. The plurality of elongated holes of the exit grid may be arranged in a plurality of rows and a plurality of columns, such that each of the holes in each column are aligned with the holes in the preceding and following column, such that a line passing through the major axis of holes in the same row would intersect at a right angle a line passing through the minor axis of holes aligned in the same column.

According to other aspects, a plasma ion implant system is provided, comprising: a processing chamber; a grid assembly placed in the plasma chamber and dividing the processing chamber into a plasma section and ion implant section; a transport mechanism for transporting substrates in a travel direction and positioning the substrate under the grid assembly; wherein the grid assembly comprises a flat plate having a plurality of holes, wherein the holes are arranged in a plurality of rows and a plurality of columns and wherein each of the holes in each column is shifted from alignment with the holes in the preceding and following column, such that a line passing through the center of all of the holes in a selected row forms an acute angle with the travel direction. Each of the holes has a cross-sectional shape of an elongated oval having a major axis and minor axis, and having a defined depth extending through the flat plate to enable ions to pass through the elongated holes.

The system may further comprise a mask comprising a flat plate having a plurality of linear holes dispersed over its surface, each of the linear holes having a cross-sectional shape of an elongated oval having a long axis and short axis, and having a defined depth extending through the flat plate to enable ions to pass through the linear holes, wherein the linear holes are arranged in a plurality of parallel rows and linear holes in each row are separated from each other by ion blocking bridges. A major axis of each of the holes of the flat plate is aligned in a direction perpendicular to a long axis of the linear holes of the mask. The flat plate and/or the substrate may be coupled to ground potential. The transport mechanism may be a conveyor.

According to further aspects, an ion implant system is provided, comprising: a processing chamber; a plasma grid placed in the plasma chamber and dividing the processing chamber into a plasma section and ion implant section, the plasma grid comprising a plurality of holes configured to enable ions to pass from the plasma chamber into the processing chamber by forming ion beamlets, wherein ions in the ion beamlets diverge in a first direction; and a mask positioned below the plasma grid and comprising a flat plate having a plurality of holes arranged as parallel lines, wherein each hole is shaped as a line segment and wherein ion blocking bridges are provided between each two line segments in a row, and wherein the line segments are oriented in a second direction perpendicular to the first direction.

According to yet other aspects, a method for implanting ions into a substrate to thereby form parallel implanted lines in the substrate is provided, comprising: introducing a substrate to be implanted into a plasma processing chamber; positioning a mask at a predetermined gap above the substrate, the mask comprising a plurality of line segments arranged in parallel rows, wherein line segments in each row are separated by bridges that block ions impinging thereupon and the line segments in each row correspond to one implanted line; igniting plasma in the plasma processing chamber and extracting ions from the plasma so as to form beamlets of ions having divergence in a direction parallel to the direction of the rows; and, directing the beamlets to pass through the mask and implant into the substrate to thereby form the parallel implanted lines. The predetermined gap is calculated to enable diverging beamlets to implant ions at locations on the substrate that are positioned directly below the bridges, to thereby implant the plurality implanted lines, wherein each line has length corresponding to the sum of all the line segments and bridges on one row of the mask. Extracting the ions may further comprise forming beamlets that have no divergence in a direction perpendicular to the direction of the rows.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Various embodiments disclosed herein enable high throughput of substrates in a plasma or any type of ion implant system, while providing accurate implant characteristics for selective implantation. The high throughput enabled by these embodiments is particularly suitable for solar cell fabrication, although it may be used for fabrication of other items, especially when there's a need for selective ion implant with the use of a mask. Certain embodiments utilize setback of an implant mask from the wafer, although the mask may travel with the wafer. The embodiments are particularly applicable to plasma implantation system that utilizes a plasma chamber in which grids are used to extract ions from the plasma and accelerate the ions towards the wafer.

Figure 1:
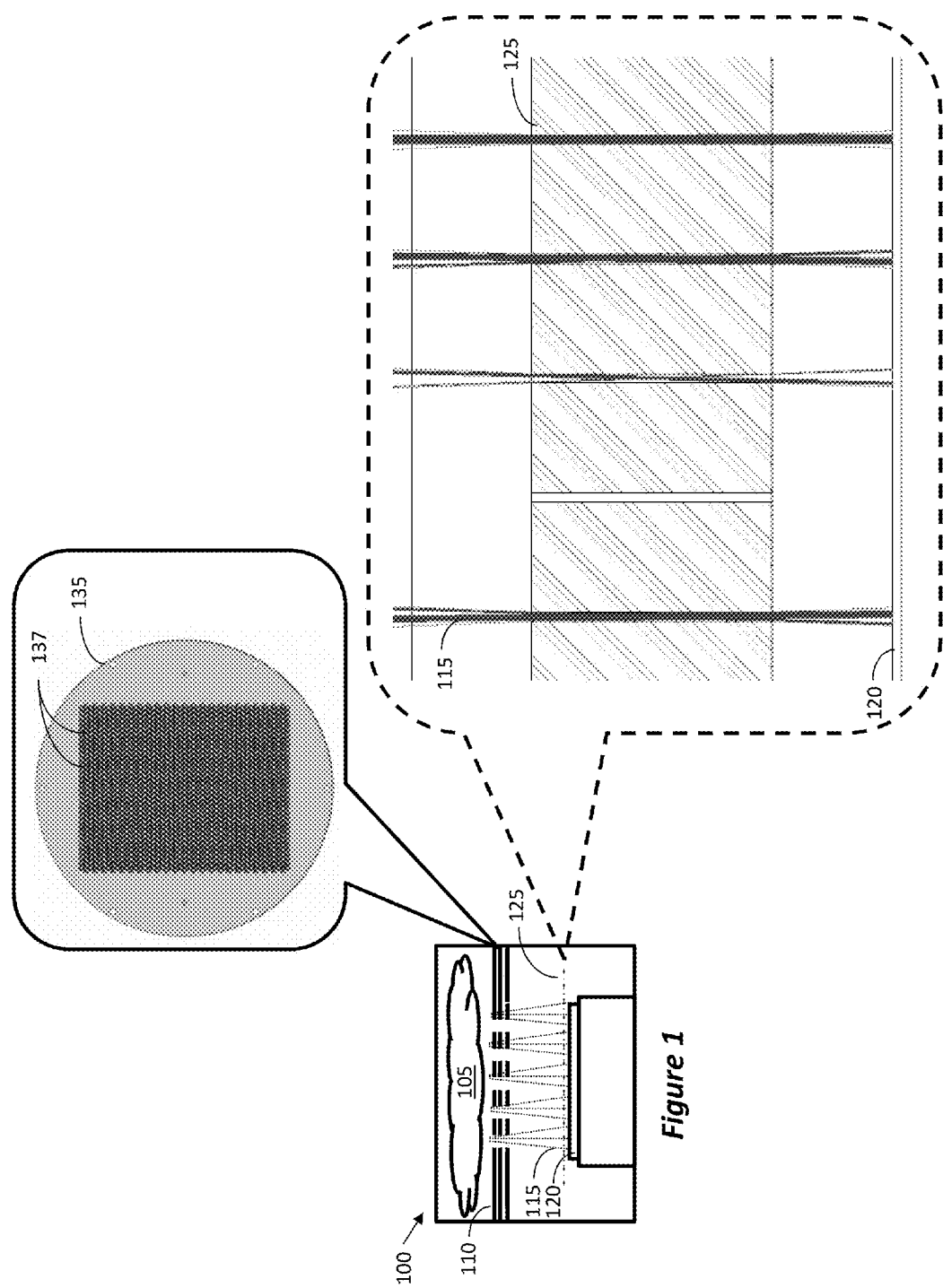
FIG. 1 is a schematic of a plasma ion implant system utilizing any of the grids and mask arrangements according to embodiments of the invention.

FIG. 1 schematically illustrates a cross-section of a plasma ion implant chamber 100. Grid assembly 110 is used to extract ion beamlets 115 from plasma 105. The grids can be biased with respect to the plasma so as to extract the ions and accelerate the ion in the ion beamlets towards the wafer 120, so as to be implanted in the wafer 120. In one example, three grids are used to form grid assembly 110: a top grid that is positively biased to extract ions, a middle grid that is negatively biased to repel electrons, and a bottom grid which is grounded. The substrate may also be grounded or it may be biased. When the bottom grid and wafer are biased, a drift zone is created between the bottom grid and wafer, such that the implant energy is determined by the extraction potential. Other grid arrangements may be used, but regardless of the arrangement, the bottom-most grid would be referred to herein as the exit grid, i.e., the last grid the ions traverse when they exit the grid assembly 110. Various embodiments for the structure of the grids will be described below, in conjunction with the design of the implant mask.

A top view of an exit grid of grid assembly 110 is shown in the top callout of FIG. 1. In this example, the exit grid is in the form of a plate 135 having a plurality of circular holes 137. When the implant should be selective, i.e., over only selected areas of the wafer, such as, e.g., for selective emitter or IBC, a mask 125 may be placed over the wafer, such that only ions passing through the holes in the mask will be implanted in the wafer.

As illustrated in FIG. 1, when ions exit the holes 137 of the exit grid 135, mutual repulsion causes the ions to travel at a divergent trajectory. Thus, while some ions enter the wafer at 90° to the surface of the wafer, divergent ions enter the wafer at an angle that is off the perpendicular to the surface of the wafer. This beam divergence is particularly problematic when a mask is used during the implant, such as, for example, for creating selective emitters or IBC.

The dashed-line callout in FIG. 1 is an enlargement showing a cross-section of part of the mask 125 and wafer 120, and the ions 115 passing through the holes in the mask 125 and hitting the wafer 120. As shown, although the aspect ratio (i.e., hole diameter over hole height) is made so as to allow mostly ion beams traveling perpendicularly to the wafer's surface, when the ions emerge from the holes of the mask they still diverge again. This necessitates placing the mask very close to the wafer in order to control the dimensions of the implanted area. Moreover, even if the mask is placed very close to the wafer, some divergence still occurs, which adversely affects the accuracy of the implant pattern, especially when the implanted features have very small dimension such as, for example, line width and pitch of selective emitters or IBC.

As shown in FIG. 1, the ions that exit each grid's hole or indeed any beam (ribbon or otherwise) are generally divergent, depending on the shape of the plasma meniscus, that is determined by multiple factors such as plasma conditions, acceleration and suppression voltages applied. On the other hand, ions that exit at close proximity to the straight edges of an elongated oval hole or sides of a slot are not as divergent, that is dictated by the shape of the meniscus. This is along the long axis of the elongated slots, rendering extracted beam non-divergent in the long direction and divergent in the short direction of the beam extraction slot. This is true for any slotted extraction grids.

Figure 2:
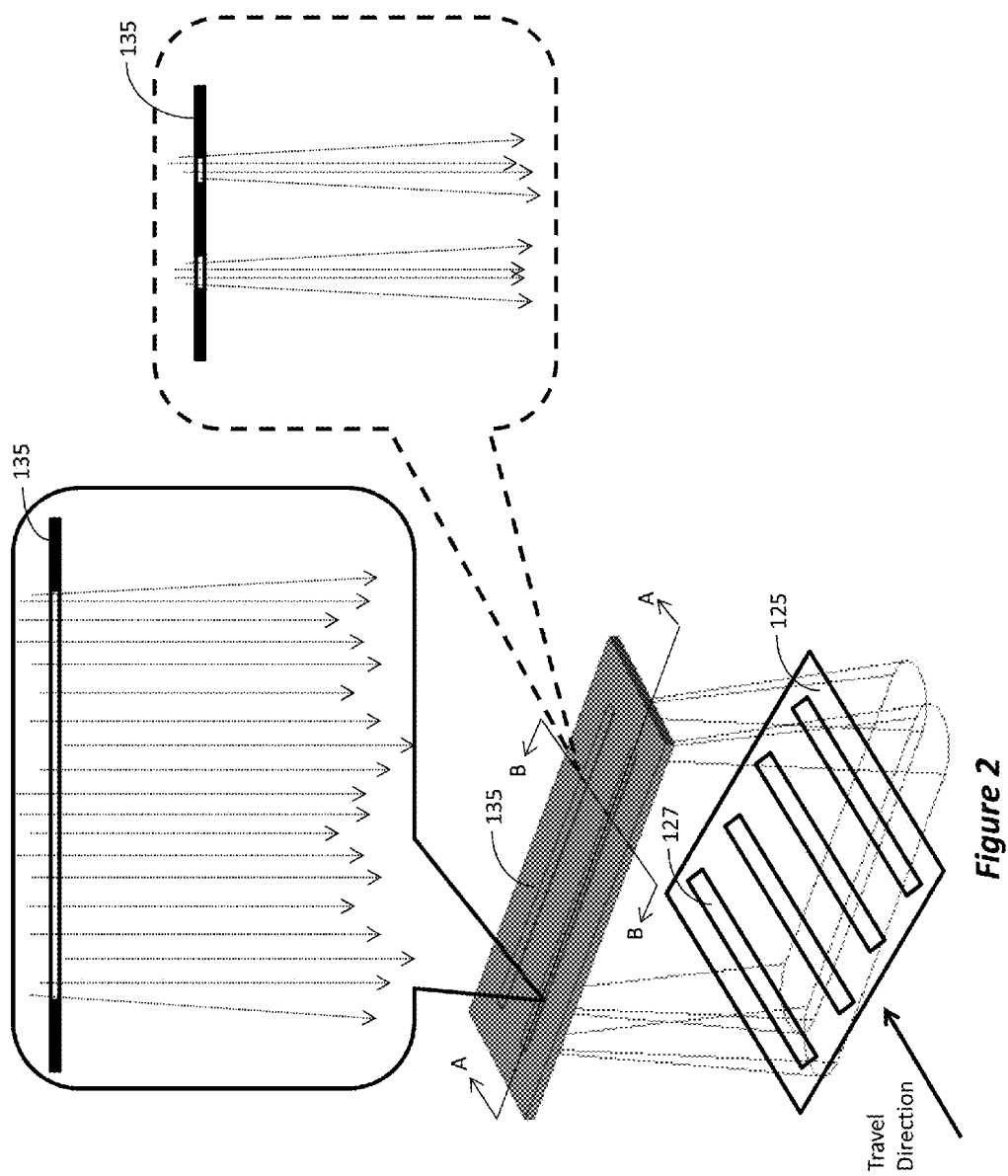
FIG. 2 is a schematic perspective view of a plasma ion implant grid according to one embodiment.

To take advantage of this phenomenon, the embodiment of FIG. 2 utilizes an exit grid having elongated oval holes or elongated slots rather than round holes. Consequently, as shown in the solid-line callout, which illustrates the cross-section along line A-A, over the long axis there is no beam divergence except at the very end of the elongated hole. Of course, as shown in the dashed-line callout, over the short axis there would be larger beam divergence. Therefore, in this embodiment the mask is oriented such that the long axis of the elongated hole is set perpendicular to the direction of the features to be implanted, as illustrated in FIG. 2. If a mask 125 is used, then the long axis of the grid holes should be perpendicular to the long axis of the features on the hard mask. Similarly, if the implant system uses movable substrate, i.e., pass-by ion implant, the motion of the substrate should be in a direction perpendicular to the long axis of the elongated grid holes.

Figure 3:
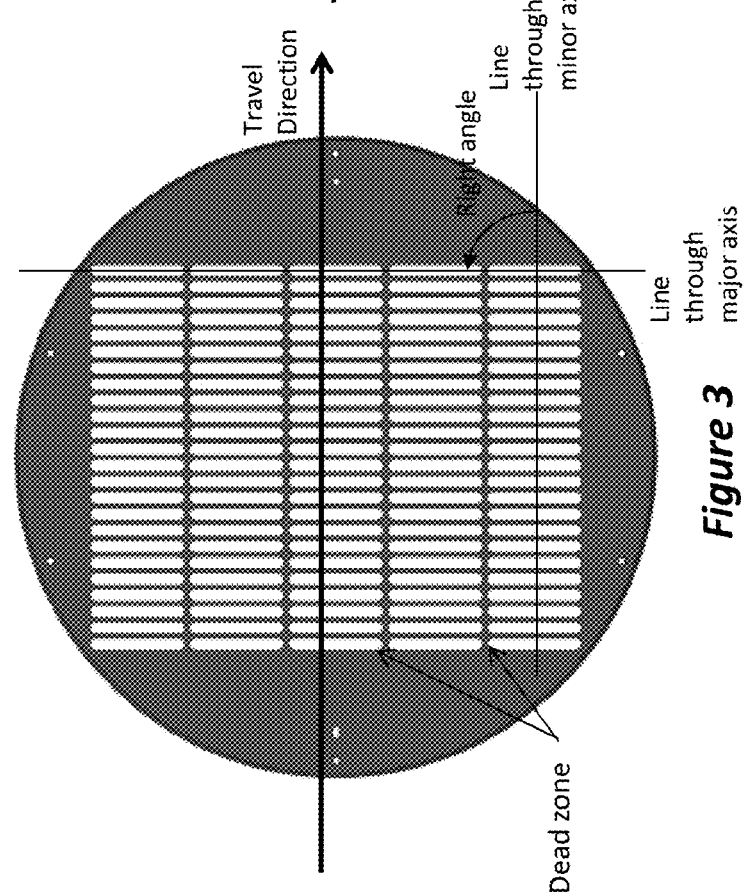
FIG. 3 is a schematic top view of a plasma ion implant grid according to anther embodiment.

While the grid according to the embodiment of FIG. 2 provides improved implant results, it is somewhat susceptible to degradation during the implant operation. Specifically, the plasma and ion extraction process causes heating of the grid. Using holes that are too long may lead to warping of the sidewall of the holes due to the excessive heat. This can be resolved by using a series of smaller elongated holes arranged in rows and columns, as illustrated in FIG. 3. The embodiment illustrated in FIG. 3 is less susceptible to degradation due to heat. In using the grid of FIG. 3, the elongated axis of the holes is positioned in a direction perpendicular to the long axis of the features to be implanted, perpendicular to the elongated holes on the mask, or perpendicular to the direction of travel of the substrate, if a pass-by implant is used.

Figure 4:
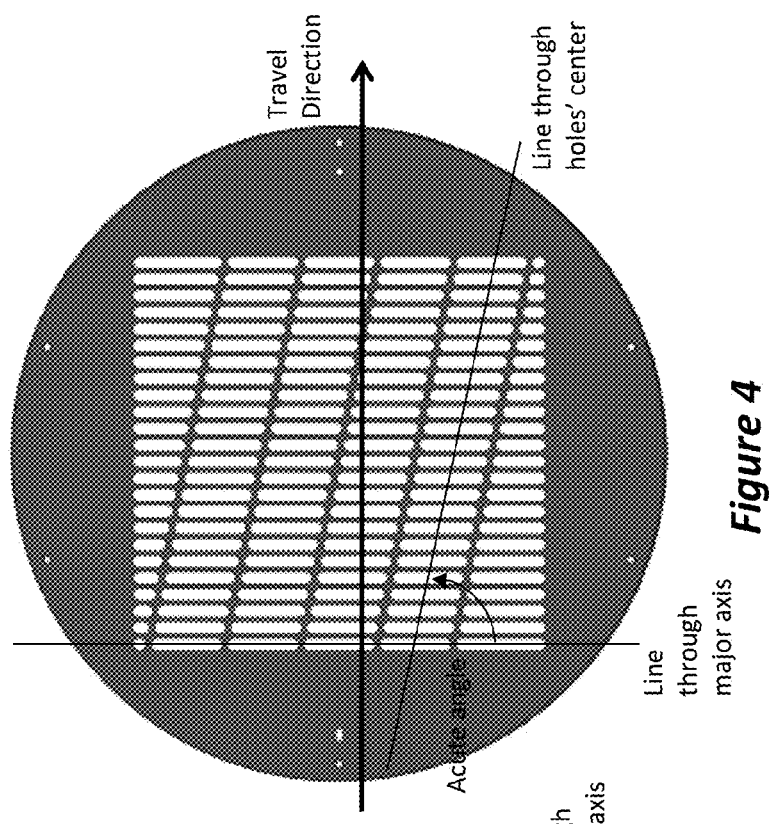
FIG. 4 is a schematic top view of a plasma ion implant grid according to anther embodiment.

The embodiment of FIG. 3 provides enhanced reliability by "breaking" the elongated holes into a series of shorter elongated holes. The shorter elongated holes are aligned in rows and columns, such that a straight line can pass through the major axis of holes in the same row, and it would intersect at a right angle a line passing through the minor axis of the holes in the same column. However, in between elongated holes there's a "dead zone" where no ions exit the grid, so that no implant occurs in the substrate travel direction, particularly for a homogenous implant. The embodiment of FIG. 4 alleviates this problem by having the holes arranged along an angled line, such that the dead zones are aligned along a line that is off from the perpendicular to the direction of travel. That is, in the embodiment of FIG. 4 each successive hole is shifted a given amount from alignment to its neighbor hole. Stating it another way, while a straight line can pass through the major axis of holes arranged in the same row, no straight line can pass through the minor axis of all the holes arranged in the same column. Also, a straight line passing through the major axis of holes arranged in the same row would intersect at a non-perpendicular angle a line passing through the center of all holes arranged in the same column. Consequently, for a traveling wafer, each point of a dead zone will be projected only once, such that all of the dead zones will be averaged and each will be covered by ions emanating from other holes. Therefore, once the wafer exits the system, each part on the wafer has been implanted, regardless of the dead zones.

Figure 5:
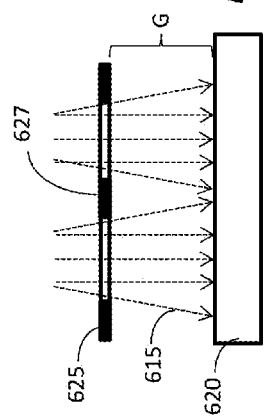
FIG. 5 is a schematic top view of a plasma ion implant grid according to anther embodiment.

A similar effect can be achieved by using round holes arranged on a diagonal or slanted direction to the direction of wafer travel. Such an embodiment is illustrated in FIG. 5. As illustrated in FIG. 5, a line passing through the center of each hole in all of the holes it passes is aligned at an acute angle to the direction of wafer travel. On the other hand, a line drawn parallel to the direction of travel cannot pass through the center of each hole it crosses. Consequently, every point on the wafer would be exposed to ions emanating from the center of some holes and the edges of other holes, such that the total implant is evened out.

In most, if not all, current implant applications, such as selective emitter and IBC, the selectively implanted features are in the form of long and narrow lines and other shapes, where lines can be of varying thickness to enhance current carrying capabilities, other shapes such as holes, Halo shapes and other features such a fiducial marking etc. One method to achieve this is to use standard photoresist or other hard mask, such as deposited or preferentially grown layered, masks and form a mask on the surface of the wafer. However, such mask formation process is long and costly and after the implant is completed the mask needs to be removed. If a second set of lines of the opposite polarity needs to be implanted, the masking needs to be repeated.

Therefore, it would be beneficial to use a shadow mask instead. Shadow masks are physical masks that are formed separately from the substrate and are plated on top or above the substrate during processing. However, when forming shadow mask for such application, the mask has many thin and long lines, as exemplified in FIG. 2. Since the mask is relatively thin and undergoes heating due to the impinging ions, the mask cannot maintain its original flat shape and the resulting implanted lines cannot be maintained according to the specifications. In addition the requirements for such selective implanted lines and fingers, that range from 100 to several micron opening width and a pitch, center to center for one type of dopant, of less than a 1000 micron, will make the shadow mask non-rigid, which makes it difficult for handling, in general, and not suitable for varying temperature, due to ion beam, and alignment accurately to the substrate. Such mask may not hold its fidelity for scribing dopant lines on the substrate consistently and over a long period of time. Furthermore, since this mask needs to be made out of thin materials, to avoid causing formation of Moiré effect, then this problem is particularly accentuated.

Figure 6A:
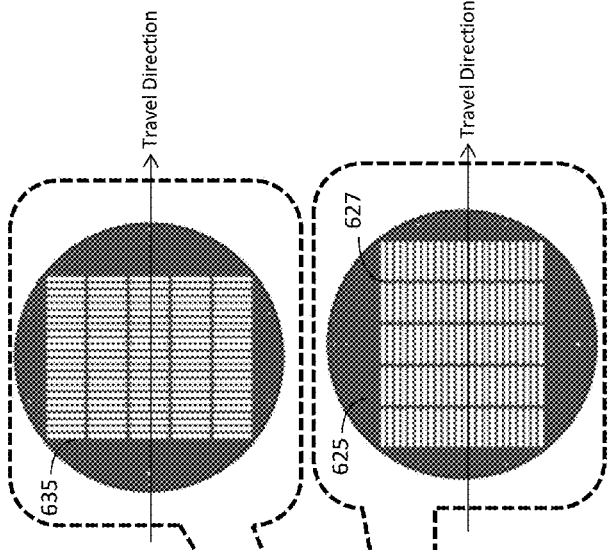
FIG. 6A illustrates an example of a shadow mask positioned over a substrate with a defined gap between the shadow mask and the substrate.
Figure 6:
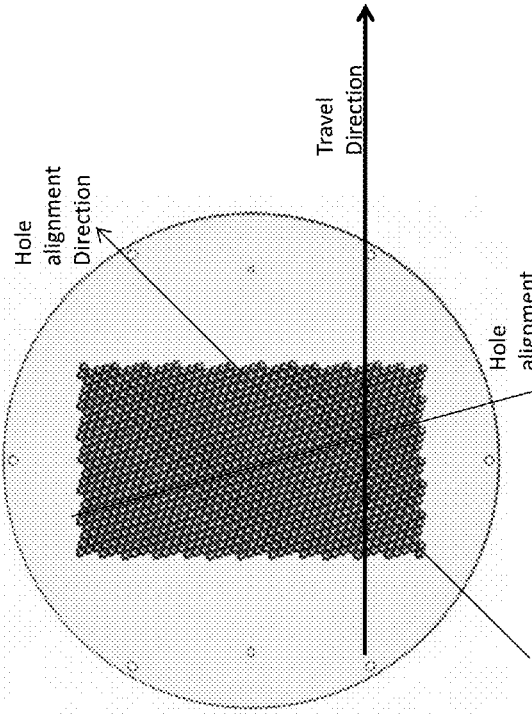
FIG. 6 is a schematic of a plasma ion implant system according to one embodiment.
Figure 6:
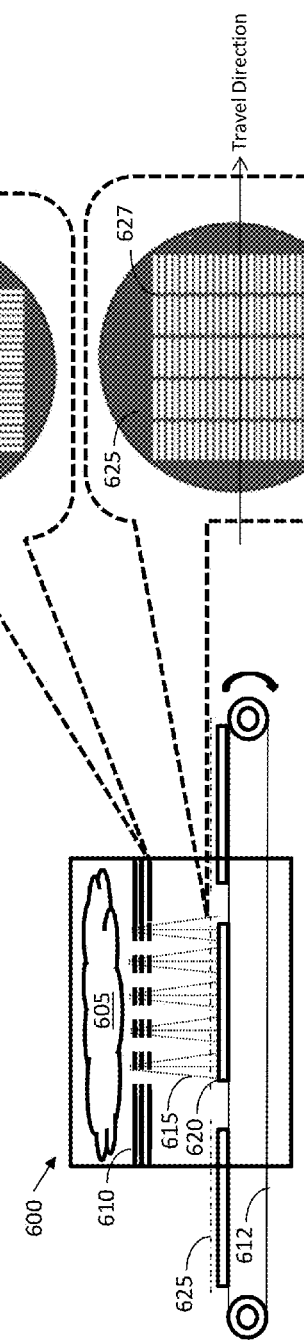

An example of an implant system that can be implemented for implanting long lines using hard mask is illustrated in FIG. 6. The plasma implant chamber may be of any design employing the grid plate or ribbons beam arrangement, but in this particular example the plasma chamber 600 has a conveyor 612 to convey wafers through the implant chamber 600. Chamber 600 has a grid assembly 610 or could have a long single or 3 to 5 slots as in the ribbon beam having an exit grid 635, which is shown in the upper callout. The grid assembly 610 is used to extract ions from plasma 605 and generate beamlets 615 directed towards the wafer 620. As illustrated in FIG. 6, since the major axis of the elongated holes in exit grid 635 are oriented perpendicular to the direction of travel of the wafers, the beamlets expand in a direction parallel to the direction of travel of the wafer, with negligible expansion in a direction perpendicular to the direction of travel of the wafer.

The mask 625 is shown in the lower callout. It is formed of a flat plate, e.g., stainless steel plate, and, rather than having long holes or elongated slots of the length required for the implanted lines, the long holes are broken using bridges 627. These bridges allow for the ease of mask fabrication and type of materials at various thickness. Of course, the actually implanted lines cannot have such bridges, since they will cause an open circuit—the implanted lines must have continuity of electrical conductance. However, by aligning the major axis of the elongated holes in the exit grid 635 to be perpendicular to the major axis of the elongated holes in the mask 625, the resulting beam divergence enables implanting ions under the bridges 627. This can be understood by referring to the illustration of FIG. 6A. Specifically, since beamlets 615 diverge in a direction parallel to the major axis of the elongated holes of mask 625, the divergent part travels under the bridge 627 so as to result in an implanted full line, rather than the line sections of the mask. By adjusting the gap, G, between the mask 625 and the wafer 620, the amount of ion implant delivered below the bridge 627 can be controlled.

Also, in the embodiment of FIG. 6, each wafer travels with its own mask. When the wafer reaches the implant zone, i.e., in alignment below the exit grid, the conveyor can be stopped or continue to travel, depending on the implant process, i.e., stationary or pass-by, and the implant process takes place. When the desired dose is achieved, or the duration of substrate passage under the beam is achieved, the ion beam is turned off or blocked and the conveyor is re-energized or continues to operate to remove the implanted wafer and introduce a new wafer underneath the beam. The mask from the implanted wafer may then be removed and cleaned for reuse.

Figure 7:
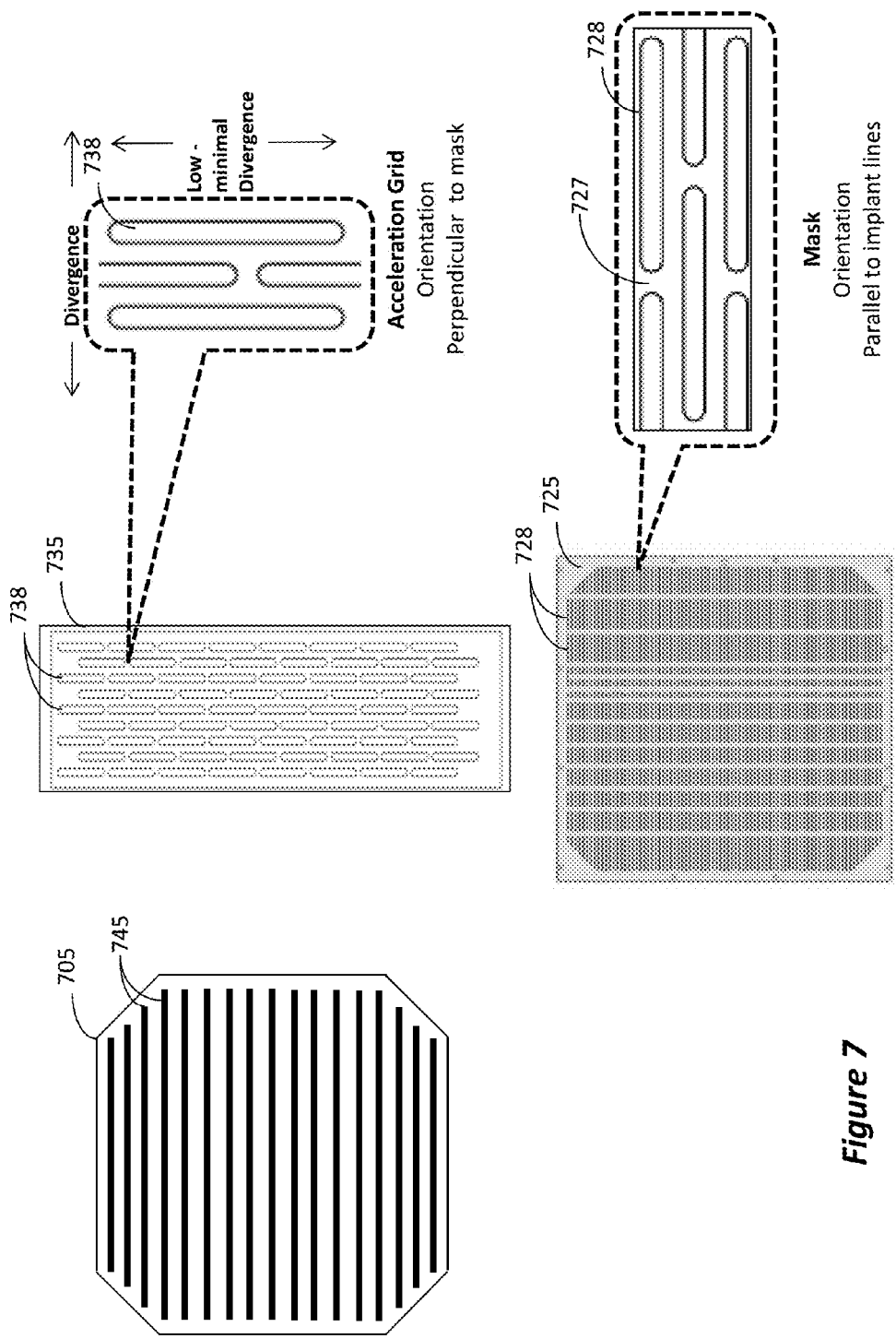
FIG. 7 is a schematic of a plasma ion implant system according to another embodiment.

Another example is illustrated in FIG. 7. In the example of FIG. 7 it is desired to implant wafer 705 with a plurality of long lines 745. These lines may form, e.g., contact lines for selective emitter cell or doping lines for IBC cell. In order to implant the long and narrow lines 745 using a hard mask, one would need to have a mask with long cut outs in the form of the implanted lines 745. That would make the mask rather flimsy and unstable during heating and cooling cycles and general handling. Instead, rather than making the mask in the form of long lines, in mask 725 each line is broken into several line segments 728 by bridges 727. However, using such a mask in standard implant system would lead to line segments implanted on the wafer, such that the line segments do not have electrical continuity. Conversely, using omnidirectional diverging ion beams would make it difficult, if not impossible, to properly control the width of the implanted lines 745. Therefore, the exit grid 735 is formed to have elongated holes or line segments 738, which are oriented with their major axis perpendicular to the major axis of the line segments 728 of the mask. This can be adopted as the required doping features on the substrate changes direction, where both the shadow mask and extraction grid can accommodate such change in direction. This arrangement leads to beam divergence in the direction of the minor axis of the elongated holes 738, i.e., in the direction parallel to the line segments of the mask. The beam divergence in this direction would provide a trajectory for ions to be implanted under the bridges 727, so as to make the implanted lines 745 continuous. Conversely, because the holes 738 are elongated, there would be little beam divergence in the direction of the long axis of holes 738. Since the long axis of holes 738 of exit grid 735 are oriented perpendicular to the long axis of holes 728 of mask 725, there would be little divergence in the direction of the width of the lines 728, such that the width of lines 745 can be closely controlled.

In the example of FIG. 7, the beamlets flare or divergence of ions exiting the elongated holes of the exit grid may be up to about 6° in the minor axis direction, but almost zero in the major axis direction—except at the two extreme edges of the elongated holes, where the divergence may also reach 6°. The gap between the mask and the wafer may be set at between zero to about several millimeters, or more likely to be about 2 mm. At such gap the beam divergence on the wafer may be up to about 420 microns. Thus, unless the beam divergence is controlled as shown in the example of FIG. 7, ion passing through a mask opening of about 150 microns width can be implanted at line width of up to about 570 microns. Therefore, if the divergence control of FIG. 7 is not employed, in order to implant a line of 150 micron width, the holes in the mask must be made much narrower, which is more difficult and more costly to fabricate and control. Conversely, since in FIG. 7 the divergence of the beam is controlled in the direction of the line width, the width of the holes in the mask may be made of the same width as the lines to be implanted, making it simpler and cheaper to fabricate.

While the elongated holes or slots of the masks in the above embodiments are shown to all have the same shape and length, this is not necessary. To the contrary, the elongated slots of the masks may be of different shapes and lengths. For example, mask 725 of FIG. 7 has elongated slots 728 of different lengths.

The above described embodiment may be implemented in a method for implanting ions to fabricate solar cells. The method proceeds by introducing a wafer to be implanted into the plasma processing chamber and positioning a mask at a predetermined gap above the wafer. The mask is configured to comprise a plurality of line segments of varying shape and size, arranged in parallel rows, and line segments in each row are separated by bridges that block ions impinging thereupon. The method proceeds by igniting plasma in the plasma processing chamber and extracting ions from the plasma so as to form beamlets of ions having divergence in a direction parallel to the direction of the rows. The predetermined gap is calculated to enable diverging beamlets to implant ions at locations on the wafer that are positioned directly below the bridges, to thereby implant plurality of implanted lines each having length corresponding to the sum of all the line segments and bridges on one row of the mask.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A plasma ion implant system for implanting ions into a substrate so as to form lines for interdigitated back-contact solar cell, comprising:
   a processing chamber;
   a grid assembly placed in the plasma chamber and dividing the processing chamber into a plasma section and ion implant section, the grid assembly configured to form beamlets of ions having divergence in a direction parallel to the lines;
   a transport mechanism for transporting substrates in a travel direction and positioning the substrate under the grid assembly;
   a plurality of masks, each mask placed on one substrate and comprising a plurality of elongated holes forming line segments arranged in parallel rows that are parallel to the lines for interdigitated back-contact solar cell, wherein line segments in each row are separated by bridges that block ions impinging thereupon and the line segments in each row correspond to one implanted line forming the lines for interdigitated back-contact solar cell; and,
   wherein the divergence in the beamlets is configured to be in the direction parallel to the line segments of the mask so as to provide a trajectory for ions to be implanted under the bridges.

2. The implant system of claim 1, wherein the grid assembly is configured to cause beamlets divergence of ions up to 6° in a direction parallel to the lines.

3. The implant system of claim 1, further configured to form a gap between the mask and the substrate, the gap set at between zero to 2 mm.

4. The implant system of claim 1, wherein the grid assembly comprises a flat plate having a plurality of elongated holes dispersed over its surface, each of the elongated holes having a cross-sectional shape of an elongated oval having a major axis and minor axis, and having a defined depth extending through the flat plate, wherein a major axis of each of the elongated holes is configured to be aligned in a direction perpendicular to a long axis of features to be implanted on a substrate when the grid is installed inside a plasma ion implant system.

5. The implant system of claim 4, wherein the plurality of elongated holes are arranged in a plurality of rows and a plurality of columns, such that each of the holes in each column are aligned with the holes in the preceding and following column, such that a line passing through the major axis of holes in the same row would intersect at a right angle a line passing through the minor axis of holes aligned in the same column.

6. The implant system of claim 4, wherein the plurality of elongated holes are arranged in a plurality of rows and a plurality of columns, such that each of the holes in each column is shifted from alignment with the holes in the preceding and following column, such that a line passing through the center of all of the holes in a selected column forms an acute angle with a line passing through the major axis of holes in the same row.

7. The implant system of claim 4, wherein the plurality of elongated holes are arranged in a plurality of rows and a plurality of columns enclosed within a rectangular area, such that each of the holes in each column is shifted from alignment with the holes in the preceding and following column, such that a line passing through the center of all of the holes in a selected row forms an acute angle with sides of the rectangular area.

8. The implant system of claim 4, wherein the plurality of elongated holes are arranged in a plurality of rows and a plurality of columns thereby forming dead zones in between the holes, such that each of the holes in each column is shifted from alignment with the holes in the preceding and following column, such that a line passing through the center of all of the dead zones in a selected row forms an acute angle with a direction of travel of a substrate to be implanted.

9. The implant system of claim 1, wherein the grid assembly comprises a flat plate having a plurality of round holes, wherein the holes are arranged in a plurality of rows and a plurality of columns within a rectangular area and wherein each of the holes in each column is shifted from alignment with the holes in the preceding and following column, such that a line passing through the center of all of the holes in a selected row forms an acute angle with sides of the rectangular area.

10. The implant system of claim 1, wherein the grid assembly comprises a flat plate having a plurality of round holes, wherein the holes are arranged in a plurality of rows and a plurality of columns and wherein each of the holes in each column is shifted from alignment with the holes in the preceding and following column, such that a line passing through the center of all of the holes in a selected row forms an acute angle with the direction of travel of a substrate to be implanted.

11. The implant system of claim 1, wherein the grid assembly comprises a flat plate having a plurality of round holes, wherein the holes are arranged in a plurality of rows and a plurality of columns thereby forming dead zones in between the holes, such that each of the holes in each column is shifted from alignment with the holes in the preceding and following column, such that a line passing through the center of all of the dead zones in a selected row forms an acute angle with a direction of travel of a substrate to be implanted.

12. The implant system of claim 1, wherein the grid assembly comprises a combination of exit grid and implant mask for a plasma-based ion implant system, wherein:
the exit grid comprises a flat plate having a plurality of elongated holes dispersed over its surface, each of the elongated holes having a cross-sectional shape of an elongated oval having a major axis and minor axis, and having a defined depth extending through the flat plate to enable ions to pass through the elongated holes;
the implant mask comprises a flat plate having a plurality of linear holes dispersed over its surface, each of the linear holes having a cross-sectional shape of an elongated oval having a long axis and short axis, and having a defined depth extending through the flat plate to enable ions to pass through the linear holes, wherein the linear holes are arranged in a plurality of parallel rows and linear holes in each row are separated from each other by ion blocking bridges; and,
wherein a major axis of each of the elongated holes is aligned in a direction perpendicular to a long axis of the linear holes.

13. The implant system of claim 12, wherein the plurality of elongated holes of the exit grid are arranged in a plurality of rows and a plurality of columns, such that each of the holes in each column are aligned with the holes in the preceding and following column, such that a line passing through the major axis of holes in the same row would intersect at a right angle a line passing through the minor axis of holes aligned in the same column.

14. The implant system of claim 12, wherein the plurality of elongated holes of the exit grid are arranged in a plurality of rows and a plurality of columns, such that each of the holes in each column is shifted from alignment with the holes in the preceding and following column, such that a line passing through the center of all of the holes in a selected column forms an acute angle with a line passing through the major axis of holes in the same row.

15. A method for implanting ions into a substrate so as to form lines for interdigitated back-contact solar cell, comprising:
igniting plasma in a plasma processing chamber and extracting ions from the plasma through a grid assembly so as to form beamlets of ions having divergence in a direction parallel to the lines;
placing masks on substrates to be implanted, the mask comprising a plurality of elongated holes forming line segments arranged in parallel rows, wherein line segments in each row are separated by bridges that block ions impinging thereupon and the line segments in each row correspond to one implanted line forming the lines for interdigitated back-contact solar cell;
placing the substrates on a conveyor so as to be transported to implant zone; and, directing the beamlets to pass through the mask and implant into the substrate to thereby form the parallel implanted lines for the interdigitated back-contact solar cell.

16. The method of claim 15, further comprising forming a gap between the mask and the substrate, the gap being set at between zero to 2 mm.

17. The method of claim 16, wherein the predetermined gap is calculated to enable diverging beamlets to implant ions at locations on the substrate that are positioned directly below the bridges, to thereby implant the plurality implanted lines, wherein each line has length corresponding to the sum of all the line segments and bridges on one row of the mask.

18. The method of claim 15, wherein extracting the ions further comprises forming beamlets that have no divergence in a direction perpendicular to the lines.

19. The method of claim 15, wherein extracting the ions further comprises forming beamlets that have no divergence in the direction of width of the lines for the interdigitated back-contact solar cell.

20. The method of claim 15, further comprising forming the mask with elongated holes having width of the same width as the lines to be implanted.

* * * * *